United States Patent
Yao et al.

(10) Patent No.: US 10,672,495 B1
(45) Date of Patent: Jun. 2, 2020

(54) E-FUSE BURNING CIRCUIT AND E-FUSE BURNING METHOD

(71) Applicant: Elite Semiconductor Memory Technology Inc., Hsinchu (TW)

(72) Inventors: Tse-Hua Yao, Hsinchu County (TW); Yi-Fan Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 16/576,727

(22) Filed: Sep. 19, 2019

Related U.S. Application Data

(63) Continuation-in-part of application No. 16/442,536, filed on Jun. 16, 2019.

(51) Int. Cl.
*G11C 29/02* (2006.01)
*G11C 7/12* (2006.01)
*G11C 8/18* (2006.01)
*G11C 8/08* (2006.01)
*G11C 7/10* (2006.01)

(52) U.S. Cl.
CPC .......... *G11C 29/027* (2013.01); *G11C 7/1087* (2013.01); *G11C 7/12* (2013.01); *G11C 8/08* (2013.01); *G11C 8/18* (2013.01)

(58) Field of Classification Search
CPC ....... G11C 29/027; G11C 7/1087; G11C 7/12; G11C 8/08; G11C 8/18
USPC ........................................................ 327/525
See application file for complete search history.

(56) References Cited

U.S. PATENT DOCUMENTS

| | | |
|---|---|---|
| 2007/0121411 A1 | 5/2007 | Riley |
| 2009/0109790 A1 | 4/2009 | Miyatake |
| 2016/0307639 A1 | 10/2016 | Lim |

*Primary Examiner* — John W Poos
(74) *Attorney, Agent, or Firm* — Winston Hsu

(57) ABSTRACT

An E-fuse burning circuit comprising: a burning directing circuit, configured to receive first input data comprising first input address and burning directing data, to generate a burning directing signal according to the burning directing data; a ring address latch, configured to latch the first input address responding to a first clock signal, and configured to output second input address responding to the first clock signal; and a control signal generating circuit, configured to generate at least one stop signal to determine whether the data in the ring address latch is shifted or not. The ring address latch applies a first number of the stages when the burning directing signal indicates a row of the E-fuse circuit is to be burned and applies a second number of the stages when the burning directing signal indicates a column of the E-fuse circuit is to be burned.

19 Claims, 21 Drawing Sheets

E-FUSE BURNING CIRCUIT AND E-FUSE BURNING METHOD

CROSS REFERENCE TO RELATED APPLICATIONS

This application is a continuation-in-part of applicant's earlier application, Ser. No. 16/442,536, filed 2019 Jun. 16, and is included herein by reference.

BACKGROUND OF THE INVENTION

1. Field of the Invention

The present invention relates to an E-fuse burning circuit and an E-fuse burning method, and particularly relates to an E-fuse burning circuit and an E-fuse burning method which can concurrently burn a row failed address and a column failed address.

2. Description of the Prior Art

Conventional memory requires two testing stages before leaving the factory; for example, a Chip Probing (CP) mode and a Final Test (FT) mode are executed to test memories. During a typical testing process, when a word line corresponding to an input address is found defective, a redundancy word line is accessed to repair the defective word line.

However, in some situations, different chips may have fail cell addresses with different directions. For example, one chip has row failed addresses of fail cells, but another chip has column failed addresses of fail cells. In such case, the row addresses and the column addresses could not be burned in the same cycle of a clock signal. Therefore, burning failed addresses with different directions needs a lot of time and the throughput rate is low.

SUMMARY OF THE INVENTION

Therefore, one objective of the present invention is to provide an E-fuse burning circuit which can concurrently burn the row failed addresses and column failed addresses.

Another objective of the present invention is to provide an E-fuse burning method which can concurrently burn the row failed addresses and column failed addresses.

Therefore, one objective of the present invention is to provide an E-fuse burning circuit which can concurrently burn the row failed addresses and column failed addresses.

Another objective of the present invention is to provide an E-fuse burning method which can concurrently burn the row failed addresses and column failed addresses.

One embodiment of the present invention discloses an E-fuse burning circuit comprising: a burning directing circuit, configured to receive first input data comprising first input address and burning directing data, to generate a burning directing signal according to the burning directing data; a ring address latch, coupled to the burning directing circuit, configured to latch the first input address responding to a first clock signal, and configured to output second input address responding to the first clock signal; and a control signal generating circuit, configured to generate at least one stop signal to determine whether the data in the ring address latch is shifted or not. The ring address latch applies a first number of the stages to output the second input address when the burning directing signal indicates a row of the E-fuse circuit is to be burned and applies a second number of the stages to output the second input address when the burning directing signal indicates a column of the E-fuse circuit is to be burned.

Another embodiment of the present invention discloses an E-fuse burning method comprising: (a) receiving first input data comprising first input address and burning directing data, to generate a burning directing signal according to the burning directing data by a burning directing circuit; (b) latching the first input address responding to a first clock signal by a ring address latch, and generating second input address responding to the first clock signal by the ring address latch; (c) generating at least one stop signal to determine whether the data in the ring address latch is shifted or not; and (d) controlling the ring address latch to apply a first number of the stages to output the second input address when the burning directing signal indicates a row of the E-fuse circuit is to be burned and applies a second number of the stages to output the second input address when the burning directing signal indicates a column of the E-fuse circuit is to be burned.

In view of above-mentioned embodiments, the burning of the row failed address or the column failed address can be controlled by the input data comprising the failed address. Besides, the burning of the row failed address or the column failed address can be concurrently burned based on above-mentioned embodiments.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, several embodiments are provided to explain the concept of the present invention. Please note, the term "first", "second" are only for identifying different devices, circuits, steps or data, signals, and do not mean to limit the sequence thereof. Besides, the circuits provided in each embodiment is only for example, any circuit can achieve the same function should also be included in the scope of the present invention.

Figure 1:
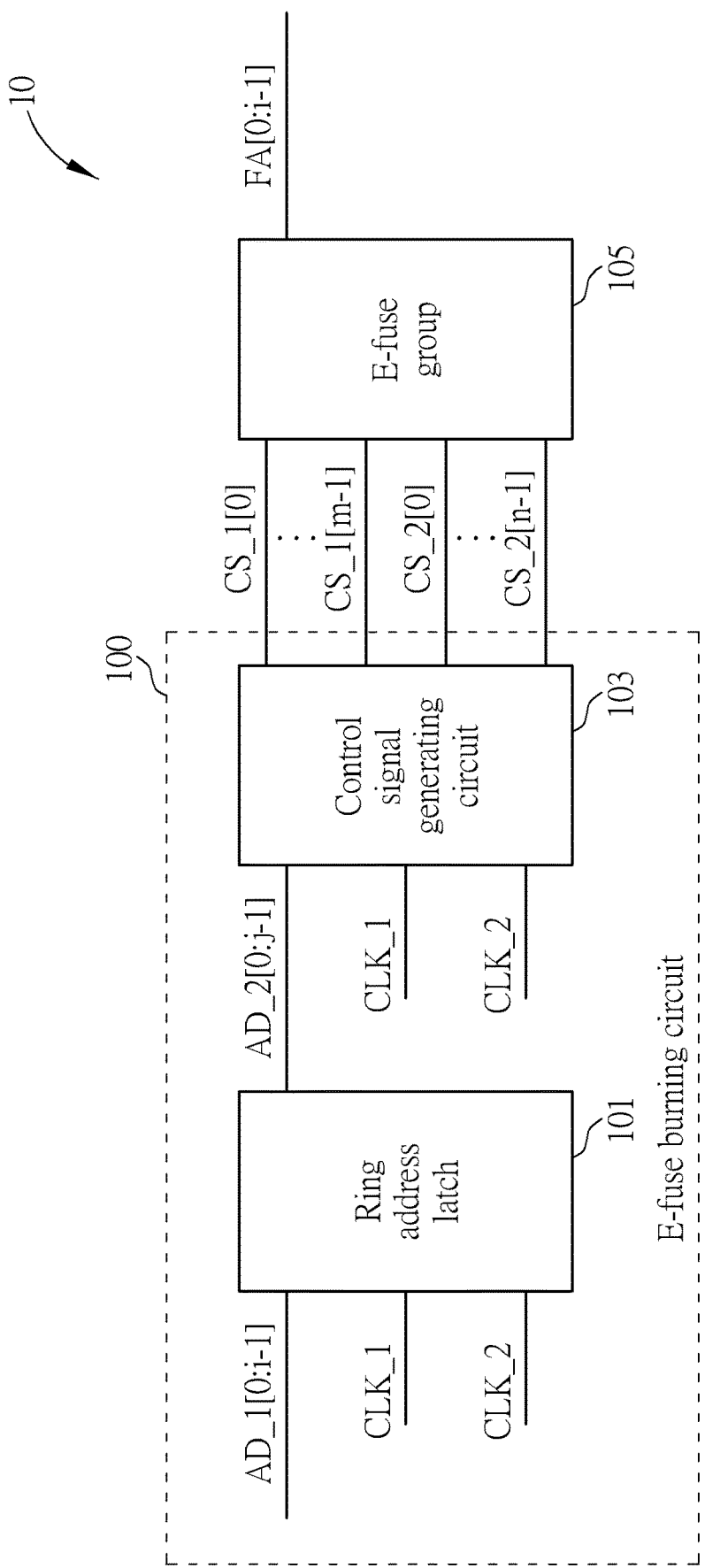
FIG. 1 is a block diagram illustrating an E-fuse circuit according to one embodiment of the present invention.

FIG. 1 is a block diagram illustrating an E-fuse circuit 10 according to one embodiment of the present invention. As illustrated in FIG. 1, the E-fuse circuit 10 comprises an E-fuse burning circuit 100 and an E-fuse group 105. The E-fuse burning circuit 100 comprises a ring address latch 101 and a control signal generating circuit 103. The ring address latch 101 is configured to receive a first input address AD_1 [0:$i$−1] arranged in serial i bits responding to a first clock signal CLK_1, and to output a second input address AD_2 [0:$j$−1] arranged in serial j bits responding to a second clock signal CLK_2. A frequency of the first clock signal CLK_1 is k times of a frequency of the second clock signal CLK_2, and k is a positive integer. The control signal generating circuit 103 is configured to receive the second input address AD_2 [0:$j$−1], and to decode the second input address AD_2 [0:$j$−1] to generate first control signals CS_1 [0:$m$−1] with m bits and second control signals CS_2 [0:$n$−1] with n bits. The first control signals CS_1 [0] . . . CS_1 [$m$−1] and the second control signals CS_2 [0] . . . CS_2 [$n$−1] are transmitted in parallel, and m, n are factors of j. The E-fuse group 105 is coupled to the control signal generating circuit 103 and comprising j fuses. If any one of the first control signals has a logic value 1 and any one of the second control signals has a logic value 1, a corresponding fuse of the E-fuse group is burned. That is, an order of the corresponding fuse corresponds to an order of the first control signal which is 1 or an order of the second control signal which is 1.

In one embodiment, the E-fuse group 105 comprises a plurality of determining switches respectively receiving different bits of the first control signals CS_1[0:$m$−1] and the second controls signals CS_2[0:$n$−1], to accordingly generate at least one fuse burning signal, which is applied to burn the fuses of the E-fuse group 105. Accordingly, which fuse is burned is determined according to the values of the first control signals CS_1[0:$m$−1] and the second control signals CS_2[0:$n$−1]. The fuse of the E-fuse circuit 105 may comprise at least one burning switch, such as a PMOS, to receive the fuse burning signal. If the burning switch is turned on and the coupled fuse is successfully burned by the fuse burning signal (e.g. change from non-conductive to conductive), the fail address FA[0:$i$−1] output by the fuse changes.

Figure 2:
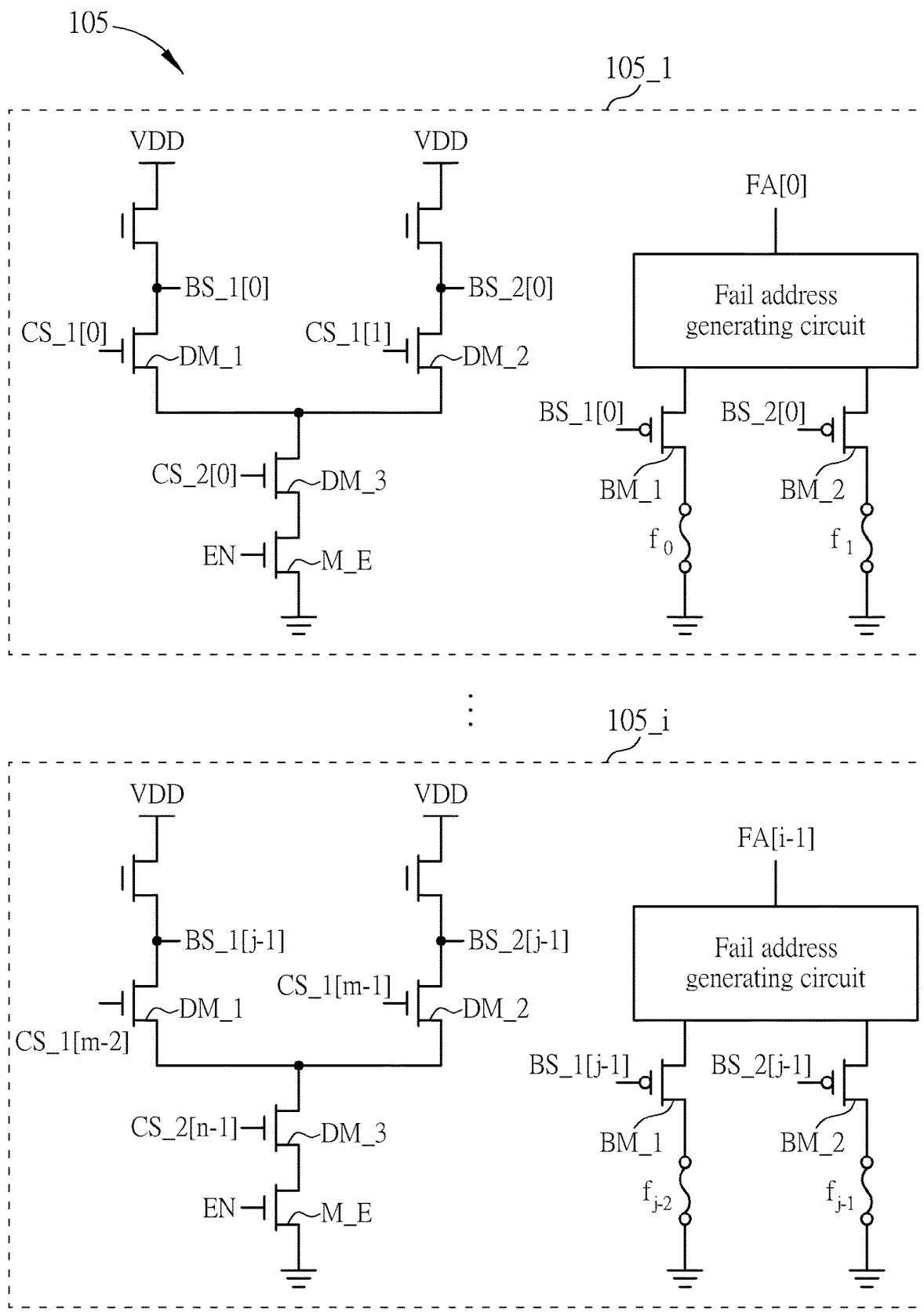
FIG. 2 is an example for the E-fuse circuit illustrated in FIG. 1.

FIG. 2 is an example for the E-fuse group 105 illustrated in FIG. 2. However, the circuits illustrated in FIG. 2 are only for the convenience of understanding and do not mean to limit the scope of the present invention. As illustrated in FIG. 2, the E-fuse group 105 comprises bit determining circuits 105_1-105_$i$ for i bits. For example, the bit determining circuit 105_1 comprises determining switches DM_1, DM_2 and DM_3 which receive the signals (bits) CS_1[0], CS_1[1] of the first control signals CS_1 and the signals CS_2[0] of the second control signals CS_2 to generate the fuse burning signals BS_1[0], BS_2[0]. The bit determining circuit 105_1 can further comprise an enable switch M_E to receive an enable signal EN to determine whether the bit determining circuit 105_1 should operate or not. In the example of FIG. 2, the logic value of the burning signal BS_1[0] is 0 if the signal CS_1[0] of the first control signals CS_1 is 1 and the signal CS_2 [0] of the second control signal is 1.

The bit determining circuit 105_$i$ comprises a circuit structure the same as which of the bit determining circuit 105_1. However, the determining switches DM_1, DM_2 and DM_3 in the bit determining circuit 105_$i$ respectively receives the signals CS_1[$m$−2], CS_1[$m$−1] of the first control signals CS_1 and the signal CS_2[$n$−1] of the second control signals CS_2 to generate the fuse burning signals BS_1[$i$−1], BS_2[$i$−2], rather than the signals CS_1[0], CS_1[1] and the signal CS_2[0].

Please refer to FIG. 2 again, the burning switches BM_1 and BM_2 respectively receive the burning signals BS_1[0], BS_2[0], and the fail address FA[0] is changed if any one of the burning switches BM_1 and BM_2 is turned on and the coupled fuses f0 and f1 are burned completely. In this embodiment, a fail address FA[0] is determined based whether the fuses f0 and f1 are successfully burned. The more the burning switches exist in one bit determining circuit and are burned one time, the higher the burning success rate is. However, each bit determining circuit can comprise only one burning switch. Since the E-fuse group 105 can comprise various structures and operations thereof are well known by persons skilled in the art, other detail descriptions of the E-fuse circuit are omitted for brevity here.

Please note, in following examples, the logic values of the signals and data are set based on the example illustrated in FIG. 2. However, persons skilled in the art can understand that the logic values of the signals and data can be changed corresponding to the circuit structure of the E-fuse circuit 105, to achieve the same function.

Please refer to FIG. 1, the ring address latch 101 receives the first input address AD_1[0:$i$−1] which are arranged in serial i bits, to output the second input address AD_2[0:$j$−1] arranged in serial j bits. In one embodiment, the second input address AD_2[0:$j$−1] is k times duplication data of the first input address AD_1 [0:$i$−1], wherein k is a positive integer and corresponds to a number of fuses to be burned (i.e. the above-mentioned fuses f0, f1) in the E-fuse group 105. For example, in one embodiment, the first input address AD_1 is 12 bits data, and the second address AD_2 is 24 bits data, in such case the burning switches for each fuse is 2, such as the example illustrated in FIG. 2.

Figure 3:
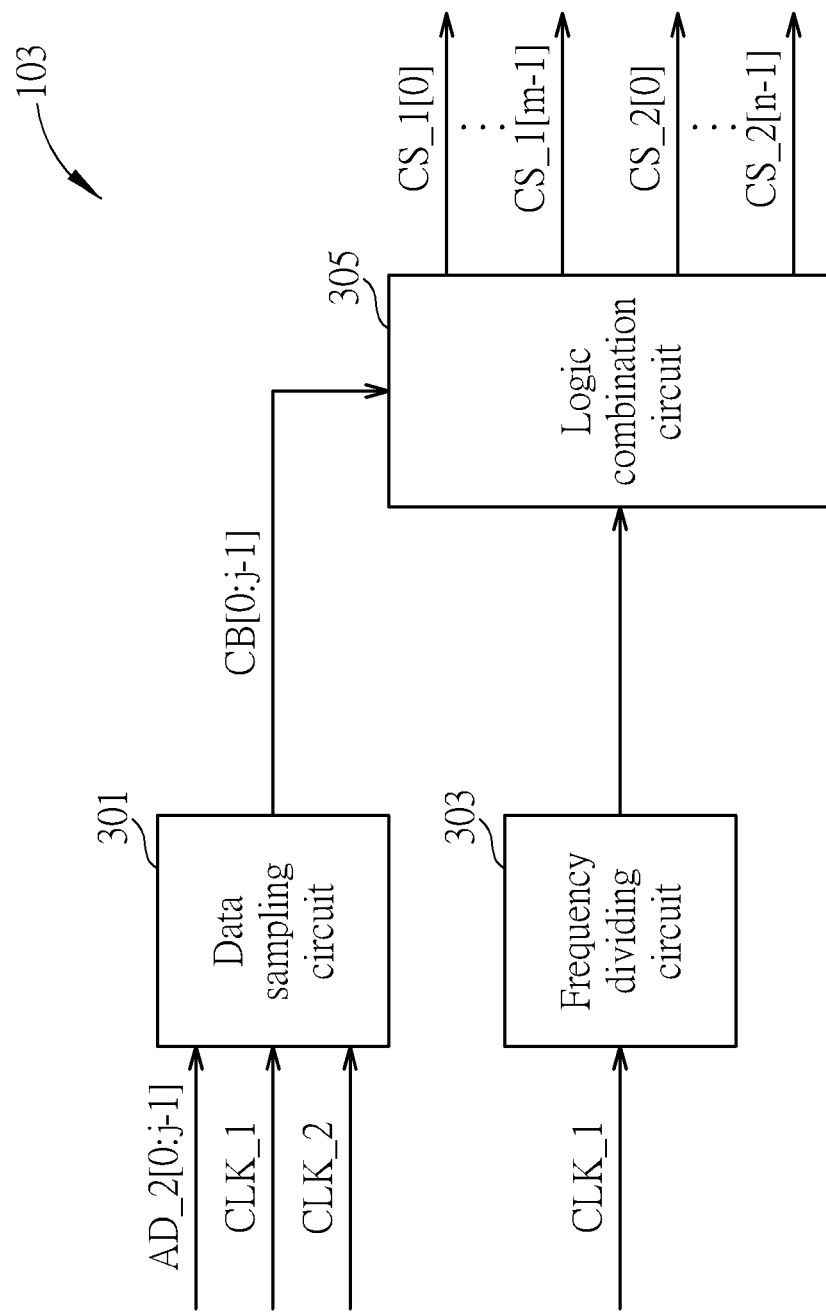
FIG. 3 is a block diagram illustrating circuit structures of the control signal generating circuit in FIG. 1 according to one embodiment of the present invention.

FIG. 3 is a block diagram illustrating circuit structures of the control signal generating circuit 103 in FIG. 1 according to one embodiment of the present invention. As illustrated in FIG. 3, the control signal generating circuit 103 comprises a data sampling circuit 301, a frequency dividing circuit 303 and a logic combination circuit 305. The data sampling circuit 301 configured to sample each bit of the second input address AD_2 [0:$j$–1] in sequence responding to the second clock signal CLK_2, and to output each bit of the second input address AD_2 [0:$j$–1] in sequence responding to the first clock signal CLK_1. The frequency dividing circuit 303 is configured to generate at least one frequency divided signal responding to the first clock signal CLK_1. The logic combination circuit 305 is configured to combine the frequency divided signal with the combined signal CB [0:$j$–1] of the data sampling circuit 301 to generate the first control signals CS_1[0:$m$–1], and configured to receive the frequency divided signal to generate the second control signals CS_2 [0:$n$–1].

Figure 4:
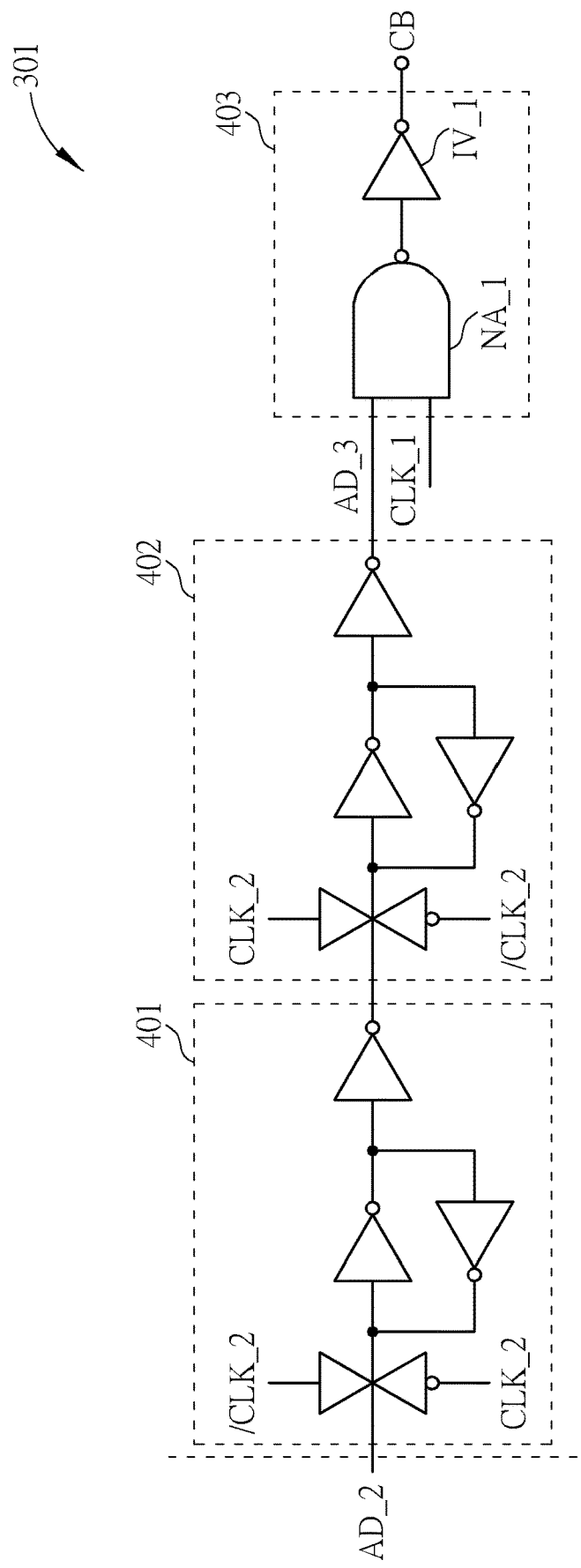
FIG. 4 is a circuit diagram illustrating circuit structures of the data sampling circuit in FIG. 3 according to one embodiment of the present invention.

FIG. 4 is a circuit diagram illustrating circuit structures of the data sampling circuit 301 in FIG. 3 according to one embodiment of the present invention. As illustrated in FIG. 4, the data sampling circuit 301 comprises a first sampling stage 401, a second sampling stage 402, and a logic circuit 403. The first sampling stage 401 is configured to sample bits of the second input address AD_2 [$o$:$j$–1] at falling edges of the second clock signal CLK_2 in sequence. The second sampling stage 402 is configured to sample bits of the second input address AD_2 [0:$j$–1] at rising edges of the second clock signal CLK_2 in sequence.

For example, when the second clock signal CLK_2 has a logic value 0, the first sampling stage 401 receives a first bit AD_2 [0] of the second input address AD_2 [0:$j$–1]. Also, when the second clock signal CLK_2 has a logic value 1, the first bit AD_2 [0] is sampled by the second sampling stage 402 and then transmitted to the logic circuit 403. Similarly, when the second clock signal CLK_2 has a logic value 0 again, the first sampling stage 401 receives a second bit AD_2 [1] of the second input address AD_2 [0:$j$–1], and when the second clock signal CLK_2 has a logic value 1 again, the second bit AD_2 [1] is sampled by the second sampling stage 402 and transmitted to the logic circuit 403 . . . and so on.

Exemplary circuits of the first sampling stage 401 and the second sampling stage 402 are illustrated in FIG. 4, but are not limited. Any circuit having the same function can be implemented as the first sampling stage 401 and the second sampling stage 402.

In this embodiment, the logic circuit 403 comprises a NAND logic gate NA_1 and an inverter IV_1. Therefore, if the first clock signal CLK_1 has a logic value 1 and a third input address AD_3 output by the second sampling stage 402 also has a logic value 1, the logic circuit 403 outputs the combined signal CB having a logic value 1. On the contrary, if the first clock signal CLK_1 has a logic value 1 and the third input address AD_3 output by the second sampling stage 402 has a logic value 0, the logic circuit 403 outputs the combined signal CB having a logic value 0. Accordingly, the combined signal CB is a combined signal of the first clock signal CLK_1 and the third input address AD_3, thus can also be regarded as a combined signal related with the first clock signal CLK_1 and the second input address AD_2.

Figure 5:
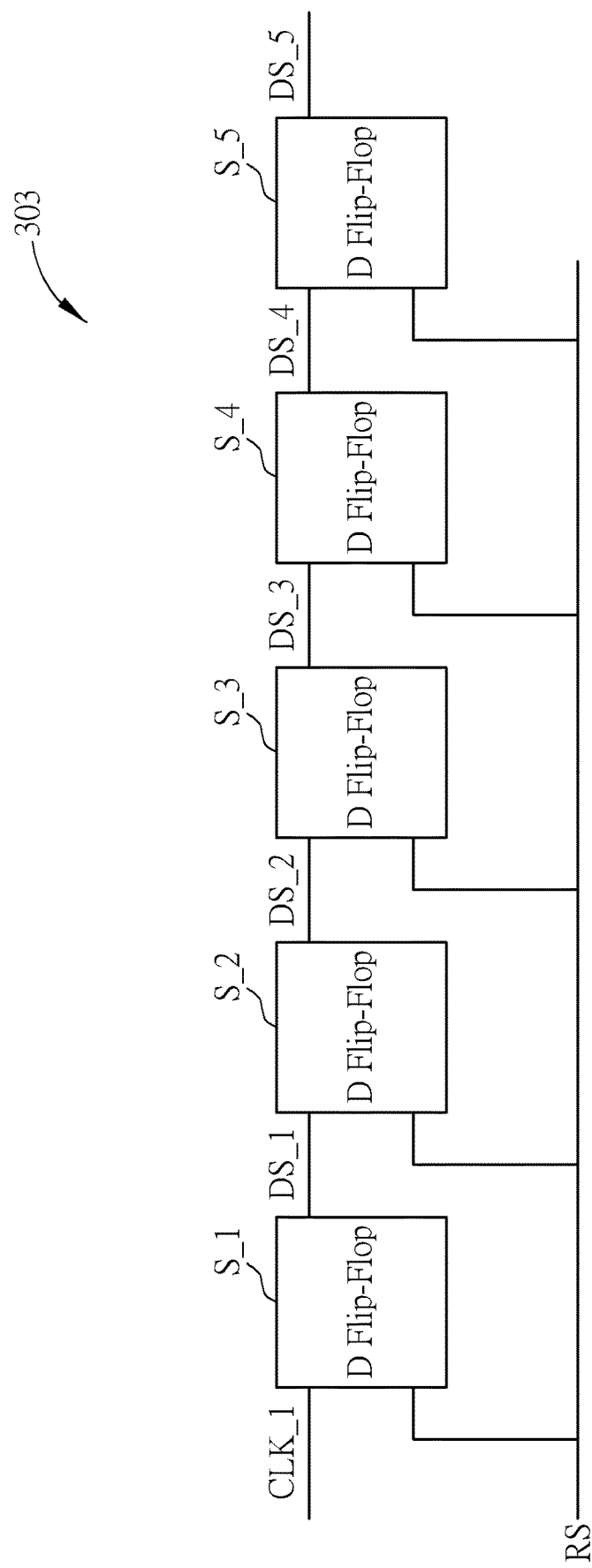
FIG. 5 is a circuit diagram illustrating circuit structures of the frequency dividing circuit in FIG. 3 according to one embodiment of the present invention.

FIG. 5 is a circuit diagram illustrating circuit structures of the frequency dividing circuit 303 in FIG. 3 according to one embodiment of the present invention. As illustrated in FIG. 5, the frequency dividing circuit 303 comprises five stages S_1-S_5, which can be flip flops, to respectively generate frequency divided signals DS_1-DS_5 responding to the first clock signal CLK_1.

In one embodiment, a frequency of the frequency divided signal DS_1 is half of the first clock signal CLK_1, a frequency of the frequency divided signal DS_2 is half of the frequency divided signal DS_1, a frequency of the frequency divided signal DS_3 is half of the signal DS_2, a frequency of the frequency divided signal DS_3 is half of the signal DS_2, a frequency of the frequency divided signal DS_4 is half of the signal DS_3, and a frequency of the frequency divided signal DS_5 is half of the frequency divided signal DS_4.

Figure 6:
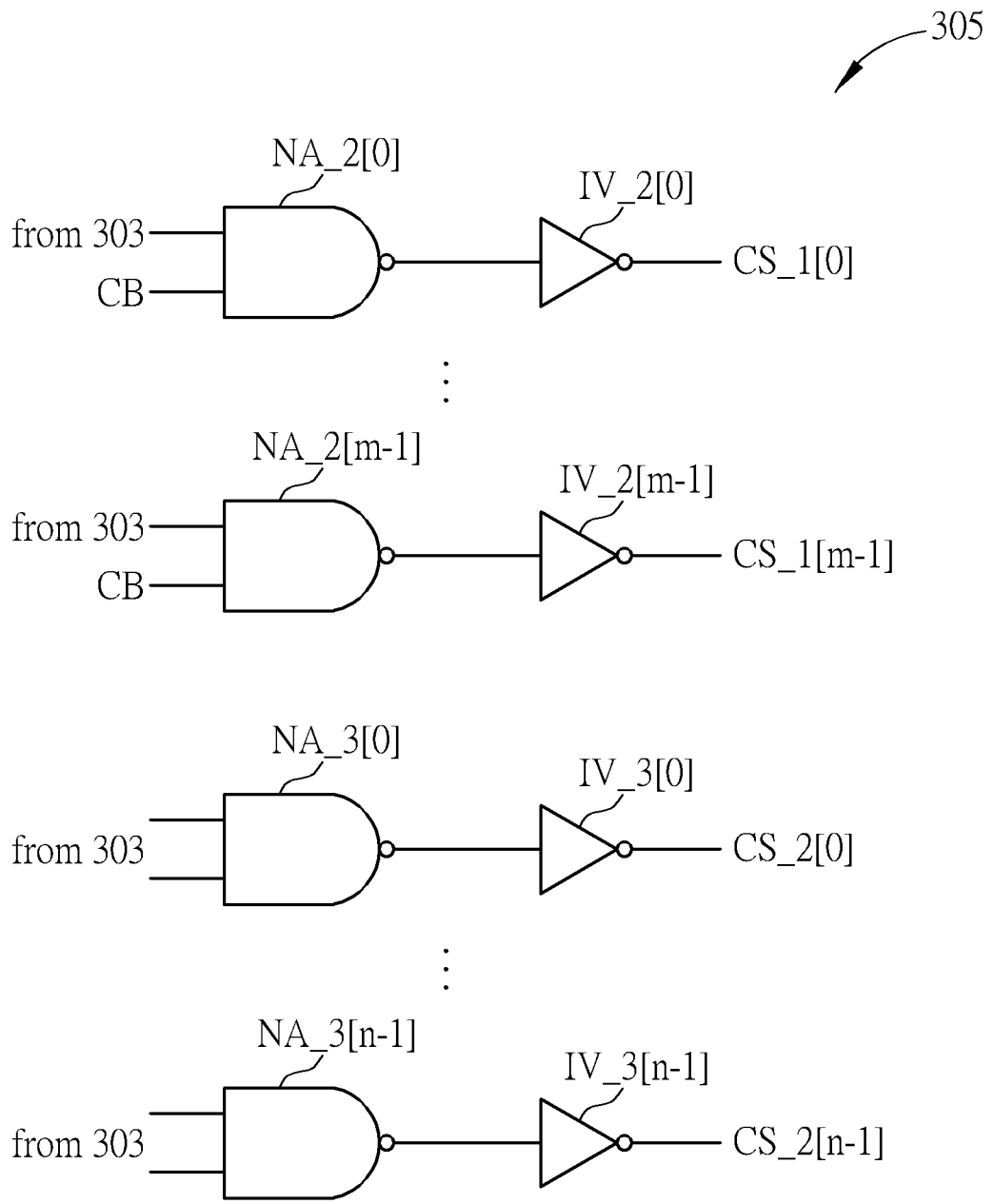
FIG. 6 is a signal diagram illustrating circuit structures of the logic combination circuit in FIG. 3 according to one embodiment of the present invention.

FIG. 6 is a circuit diagram illustrating circuit structures of the logic combination circuit 305 in FIG. 3 according to one embodiment of the present invention. As illustrated in FIG. 6, the logic combination circuit 305 comprises m second NAND logic gates NA_2, m second inverters IV_2, n third NAND logic gates NA_3, and n third inverters IV_3. Each of the second NAND logic gates NA_2 is configured to receive the frequency divided signals DS_1-DS_5 and the combined signal CB, and each of the second inverter IV_2 is configured to generate one of the first control signals CS_1 [0:$m$–1]. Each of the third NAND logic gate NA_3 is configured to receive the frequency divided signals, and each of the third inverter IV_3 is configured to generate one of the second control signals CS_2 0:$n$–1].

Please note the frequency dividing circuit 303 may comprises other numbers of stages, thus the input of the second NAND logic gate NA_2 and the third NAND logic gate NA_3 may correspondingly changes to achieve the same function.

Figure 7:
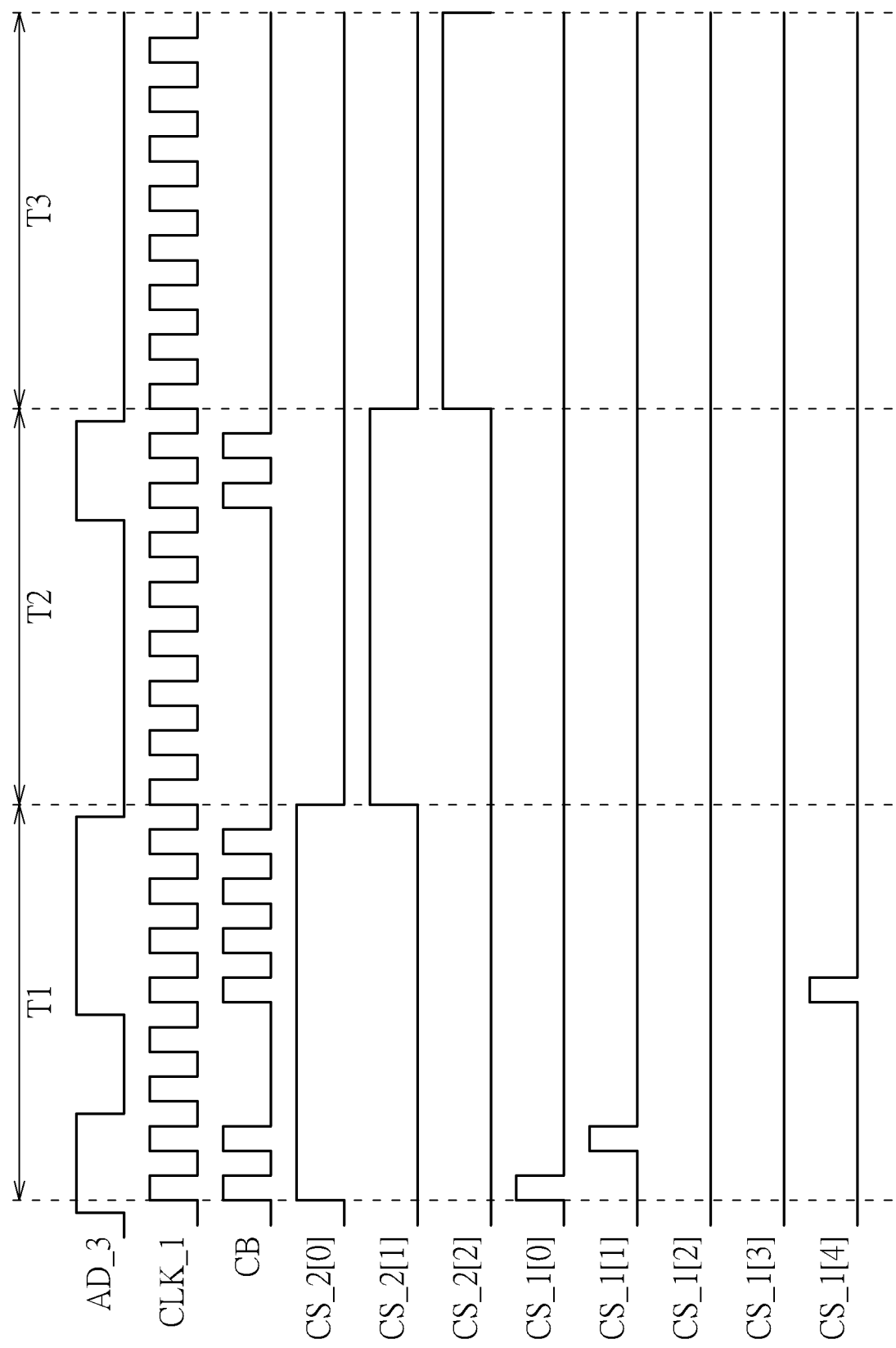
FIG. 7 is a schematic diagram illustrating signal wave forms for the signals and input addresses illustrated in the disclosed embodiments, according to one embodiment of the present invention.

FIG. 7 is a schematic diagram illustrating signal wave forms for the signals and addresses illustrated in FIG. 3-FIG. 6, according to one embodiment of the present invention.

In the embodiment of FIG. 7, the third input address AD_3 is 24 bits serial data AD_3[0:23]=[1 1 0 0 1 1 1 1 0 0 0 0 0 0 1 1 0 0 0 0 0 0 0 0]. The combined signal CB is a combined signal of the third input address AD_3 and the first clock signal CLK_1, thus is also 24 bits serial data. Responding to the first clock signal CLK_1, the combined signal CB has one bit value each time the first clock signal CLK_1 has a logic value 1. The logic combination circuit 305 receives the combined signal CB and at least one of the frequency divided signal from the frequency dividing circuit 303 and outputs one of the first control signals CS_1 based on the logic value of the combined signal CB when the first clock signal CLK_1 has a logic value 1. The second control signals CS_2 are only related to the frequency divided signal from the frequency dividing circuit 303 and are not related to the logic values of the combined signal CB.

Please refer to FIG. 7, in this embodiment, the second control signals CS_2 is 3 bits parallel data, thus the second control signal CS_2[0] has a logic value 1 during T1, which means $1^{st}$-$8^{th}$ periods of the first clock signal CLK_1. Similarly, the second control signal CS_2[1] has a logic value 1 during T2, which means $9^{th}$-$16^{th}$ periods of the first clock signal CLK_1, and the second control signal CS_2[2] has a logic value 1 during T3, which means $16^{th}$-$24^{th}$ periods of the first clock signal CLK_1. Further, the logic values of the first control signals CS_1 [0:7] are [1 1 0 0 1 1 1 1] in the $1^{st}$-$8^{th}$ periods of the first clock signal CLK_1 (T1), the logic values of the first control signals CS_1 [0:7] are [0 0 0 0 0 1 1] in the $9^{th}$-$16^{th}$ periods of the first clock signal CLK_1 (T2), and the logic values of the bits CS_1 [0:7] are

[0 0 0 0 0 0 0 0] in the 17$^{th}$-24$^{th}$ periods of the first clock signal CLK_1 (T3). For the convenience of understanding, FIG. 7 only illustrates part of the bits CS_1 [0:7] in T1.

Therefore, the 24 bits serial data of the third input address AD_3 are divided into 3 groups. The first group of the third input address AD_3 [1 1 0 0 1 1 1 1] are output responding to the first clock signal CLK_1 when the second control signal CS_2 [0]=1, the second group of the third input address AD_3 [0 0 0 0 0 0 1 1] are output responding to the first clock signal CLK_1 when the second control signal CS_2 [1]=1, and the third group of the third input address AD_3 [0 0 0 0 0 0 0 0] are output responding to the first clock signal CLK_1 when the second control signal CS_2 [2]=1

Figure 8:
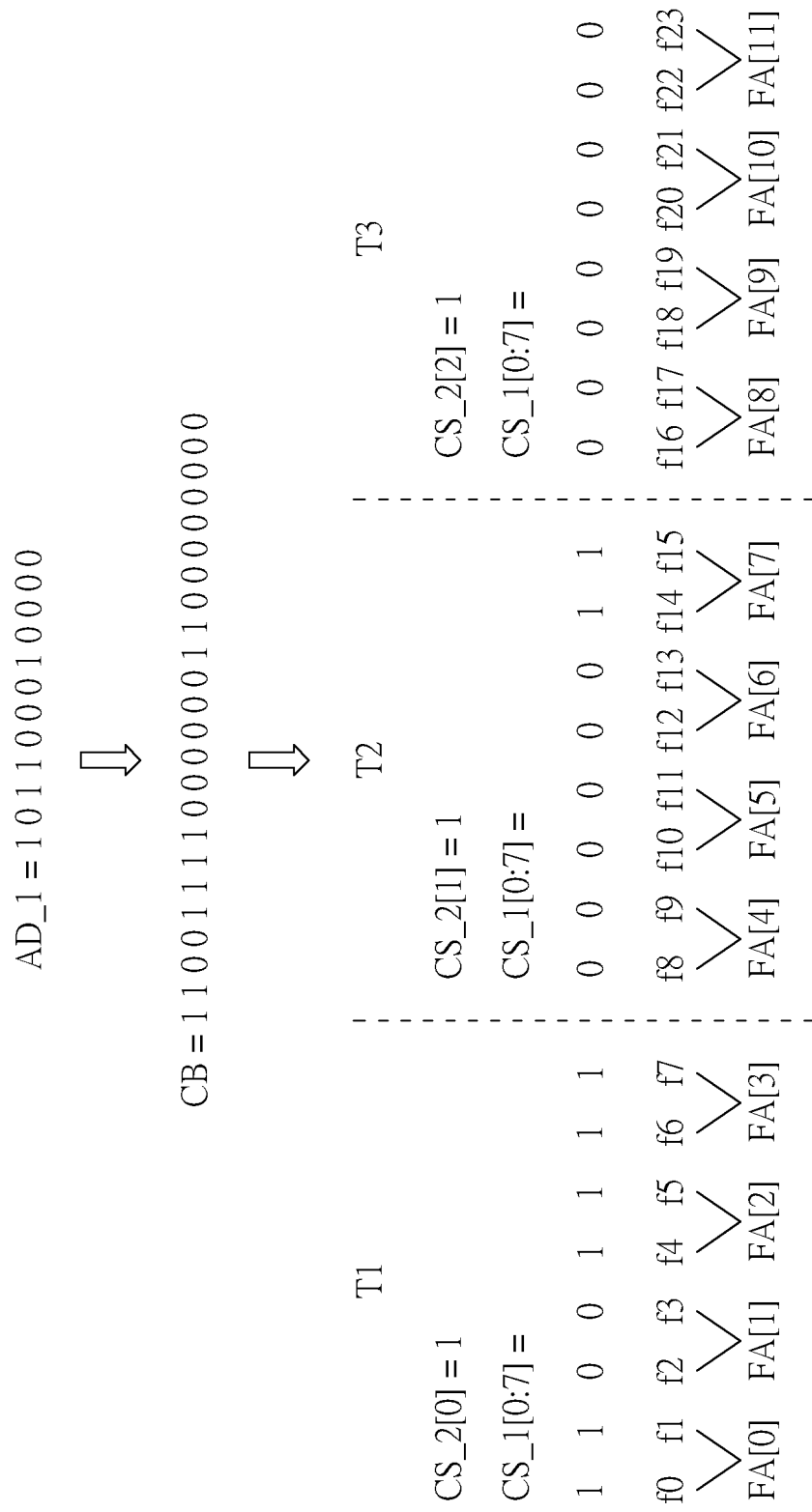
FIG. 8 is a schematic diagram illustrating relations between values for the signals and addresses illustrated in disclosed embodiments, according to one embodiment of the present invention.

FIG. 8 is a schematic diagram illustrating relations between the first address AD_1, the combined signal CB, the first control signals CS_1[0:7] and the second control signals CS_2[0:2]. FIG. 8 also illustrates relations between the fuses of the E-fuse group 105 in FIG. 1 and the first address AD_1, the combined signal CB, the first control signals CS_1[0:7] and the second control signals CS_2[0:2]. Please refer to FIG. 8, if the first input address AD_1 [0:11]=[1 0 1 1 0 0 0 1 0 0 0 0], the combined signal CB [0:23]=[1 1 0 0 1 1 1 1 0 0 0 0 0 0 1 1 0 0 0 0 0 0 0 0]. In the 1$^{st}$-8$^{th}$ periods of the first clock signal CLK_1 (T1), second control signals CS_2 [0:2]=[1, 0, 0], and the first control signals CS_1[0:7]=[1 1 0 0 1 1 1 1], which are used for determining whether the fuses f0-f7 in the E-fuse group 105 are burned or not. Also, in the 9$^{th}$-16$^{th}$ periods of the first clock signal CLK_1 (T2), second control signals CS_2 [0:2]=[0, 1, 0], and the first control signals CS_1[0:7]=[0 0 0 0 0 0 1 1], which are used for determining whether the fuses f8-f15 in the E-fuse group 105 are burned or not. Besides, in the 17$^{th}$-24$^{th}$ periods of the first clock signal CLK_1 (T3), second control signals CS_2 [0:2]=[0, 0, 1], and the first control signals CS_1[0:7]=[0 0 0 0 0 0 0 0], which are used for determining whether the fuses f16-f23 in the E-fuse group 105 are burned or not. The fuses f0-f23 mean different fuses in the E-fuse group 105.

In one embodiment, whether the fuses in the E-fuse group 105 are burned or not are determined by whether a corresponding first control signal CS_1 and a corresponding second control signal CS_2 are simultaneously 1. In the embodiment of FIG. 8, in T1, since CS_2[0]=1, CS_1[0]=1, CS_1[1]=1, CS_1[4]=1, CS_1[5]=1, CS_1[6]=1, CS_1[7]=1, thus the fuses f0,f1,f4,f5,f6,f7 are burned but the fuses f2, f3 are not burned. If any one of the fuses f0, f1 is successfully burned, the fail address FA[0]=1. Also, if any one of the fuses f4, f5 is successfully burned, the output address FA[2]=1, and if any one of the fuses f6, f7 is successfully burned, the output address FA[3]=1.

Briefly, in the embodiments of FIG. 7 and FIG. 8, the first input address AD_1 is 12 bits data and the second input address data AD_2 is 24 bits data since a frequency of the first clock signal CLK_1 is twice of a frequency of the second clock signal CLK_2. The control signal generating circuit 103 in FIG. 1 receives and decodes the 24 bits data (the second input address data AD_2), to generate eight first control signals CS_1 and three second control signals CS_2, wherein 8 and 3 are factors of 24. However, the scope of the present invention is not limited to such example. In other embodiments, the control signal generating circuit 103 receives and decodes the 24 bits data, to generate m eight first control signals CS_1 and n second control signals CS_2. The m and n can be any positive integers, for example, m=12, n=2 or m=6, n=4.

Figure 9:
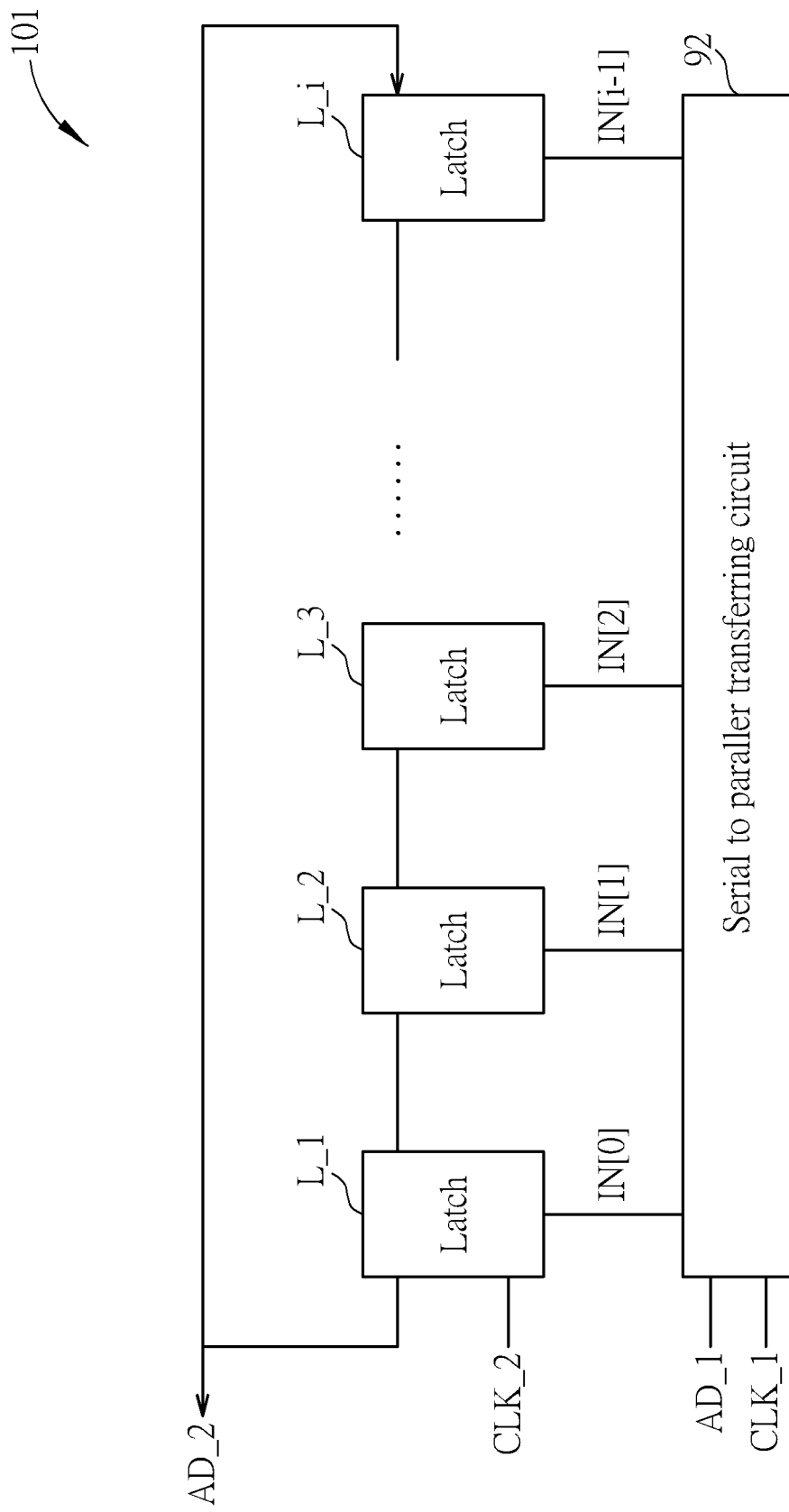
FIG. 9 is a circuit diagram illustrating a ring latch circuit according to one embodiment of the present invention.

FIG. 9 is a circuit diagram illustrating a circuit for generating the second input address AD_2 according to one embodiment of the present invention. As illustrated in FIG. 9, the ring address latch 101 receives the first input address AD_1 to output the second input address AD_2. The ring latch circuit 101 comprises a serial to parallel transferring circuit 92 and a plurality of latch stages L_1~L_i, which can be implemented by latches.

During a writing operation, the parallel transferring circuit 92 receives the first input address AD_1 in series responding the first clock signal CLK_1, and writes i bits data to the latch stages L_1~L_i in sequence. For example, at the first rising edge of the first clock signal CLK_1, a first bit of the first input address AD_1 is written as the input bit IN[0] to the latch stage L_1. Also, at the first falling edge of the first clock signal CLK_1, a second bit of the first input address AD_1 is written as the input bit IN[1] to the latch stage L_2 . . . and so on.

During a burning operation the data stored in each latch stage is shifted to a next latch stage corresponding to the second clock signal CLK_2, and the data stored in the latch stage L_1 is transmitted outside to the control signal generating circuit 103 in FIG. 1. For example, during the burning operation, the input bit IN [0] which is stored in the latch stage L_1 at a first rising edge of the second clock signal CLK_2 is transmitted outside to the control signal generating circuit 103 in FIG. 1. Also, the input bit IN[0] is written to the lath stage L_i at a second falling edge. At the same time, the input bit IN[i-1] in the latch stage L_i is written to the latch stage Li-1. For example, the input bit IN[1] in the latch stage L_2 is written to the latch stage L_1, and the input bit IN[2] in the latch stage L_3 is written to the latch stage L_2.

After that, the input bit IN [1] which is stored in the latch stage L_1 at a second rising edge of the second clock signal CLK_2 is transmitted outside to the control signal generating circuit 103 in FIG. 1. Also, the input bit IN[1] is written to the lath stage L_i at a third falling edge. At the same time, the input bit IN[i] in the latch stage L_i is written to the latch stage L_i-1. For example, the input bit IN[2] in the latch stage L_2 is written to the latch stage L_1, and the input bit IN[3] in the latch stage L_3 is written to the latch stage L_2 . . . and so on. Please note, in such embodiment, a frequency of the second clock signal CLK_2 is 1/K of a frequency of the first clock signal CLK_1. According, the second input address AD_2 output by the ring latch circuit 101 to the control signal generating circuit 103 is i*K bits data, corresponding to the first clock signal CLK_1.

In a conventional latch, the input address is not backup, thus the input address is clear after the burning operation is performed. However, the input address could not be recovered if some error occurs for the burning operation. The ring latch 101 illustrated in FIG. 9 can backup the input address while the burning operation is performed, to solve such problem.

A specific example is provided to explain the flow of FIG. 1 to FIG. 9. In one embodiment, the first input address AD_1 is serial 12 bits data (AD1 [0:11]=[1 0 1 1 0 0 0 1 0 0 0 0]). After processed by the serial to parallel transferring circuit 92 responding to the first clock signal CLK_1, 12 bits parallel input bits are generated (IN[0]-IN[11]). Thereafter, if a burn command is received, the input bits IN[0]-IN[11] are sequentially output to the control signal generating circuit 103 to generate serial 24 bits data AD_2 [0:23]=[1 1 0 0 1 1 1 1 0 0 0 0 0 0 1 1 0 0 0 0 0 0 0 0]. In this embodiment, the above-mentioned K is 2, which means a frequency of the second clock signal CLK_2 is ½ of a frequency of the first clock signal CLK_1.

Please refer to FIG. 3, after the data sampling circuit 301 of the control signal generating circuit 103 receives the second input address AD_2 responding to the second clock signal CLK_2, the data sampling circuit 301 generates the combined signal CB responding to the first clock signal CLK_1. If the combined signal CB has a logic value 1, one of the first control signals CS_1 [0:7] has a logic value 1 when the first clock signal CLK_1 has a logic value 1. At the same time, if one of the second control signals CS_2 has a logic value 1, the corresponding fuse in the E-fuse group 105 is burned.

In above-mentioned embodiments, each bit for the fail address FA is determined by two fuses, thus a frequency of the second clock signal CLK_2 used for the burning operation is selected as half of a frequency of the first clock signal CLK_1 used for the writing operation, However, it does not mean to limit the present invention. The above-mentioned embodiments are only implementation examples of the present invention. The scope of the present invention should base on claims illustrated herein after.

In the above-mentioned embodiments, the clock signal and the address data are combined to save a number of the transmission lines. However, as stated in the prior art, in some situations, different chips may have failed addresses with different directions. Therefore, the present invention provides following embodiments to solve such problem.

Figure 10:
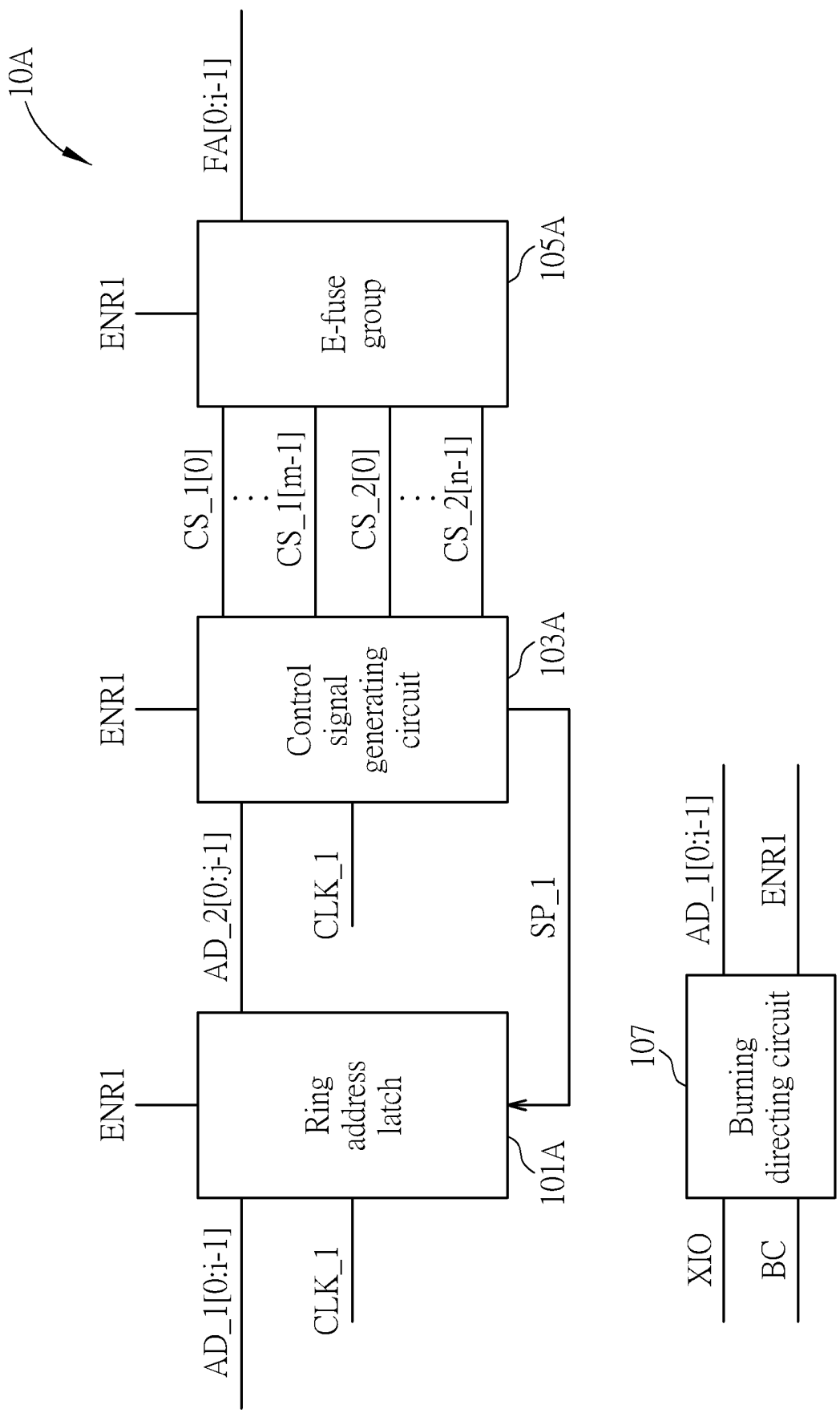
FIG. 10 is a block diagram illustrating an E-fuse circuit 10A according to another embodiment of the present invention.

FIG. 10 is a block diagram illustrating an E-fuse circuit 10A according to another embodiment of the present invention. As stated in FIG. 10, besides the ring address latch 101A, the control signal generating circuit 103A, and the E-fuse group 105A, the E-fuse circuit 10A further comprises a burning directing circuit 107. The ring address latch 101A is configured to latch the first input address AD_1 responding to a first clock signal CLK_1, and configured to output second input address AD_2 responding to the first clock signal CLK_1.

The burning directing circuit 107 is configured to receive first input serial data XIO comprising first input address AD_1 and burning directing data (e.g. the following burning code BC), to generate a burning directing signal ENR1 according to the burning directing data. For example, in the embodiment of FIG. 1, if a bank (not shown) corresponding to the E-fuse group 105A has a row address of failed cells, the first input address AD_1 is a row failed address. The burning directing circuit 107 generates a burning directing signal ENR1 to control the control signal generating circuit 103A, and the E-fuse group 105A to generate failed address FA [0:i−1] to indicate the row address of failed cells. For another example, if a bank (not shown) corresponding to the E-fuse circuit 105 has a column address of the failed cells, the first input address AD_1 is a column failed address. The burning directing circuit 107 generates a burning directing signal ENR1 to control the control signal generating circuit 103A, and the E-fuse group 105A to generate failed address FA [0:i−1] to indicate the column address of the failed cells.

Figure 11:
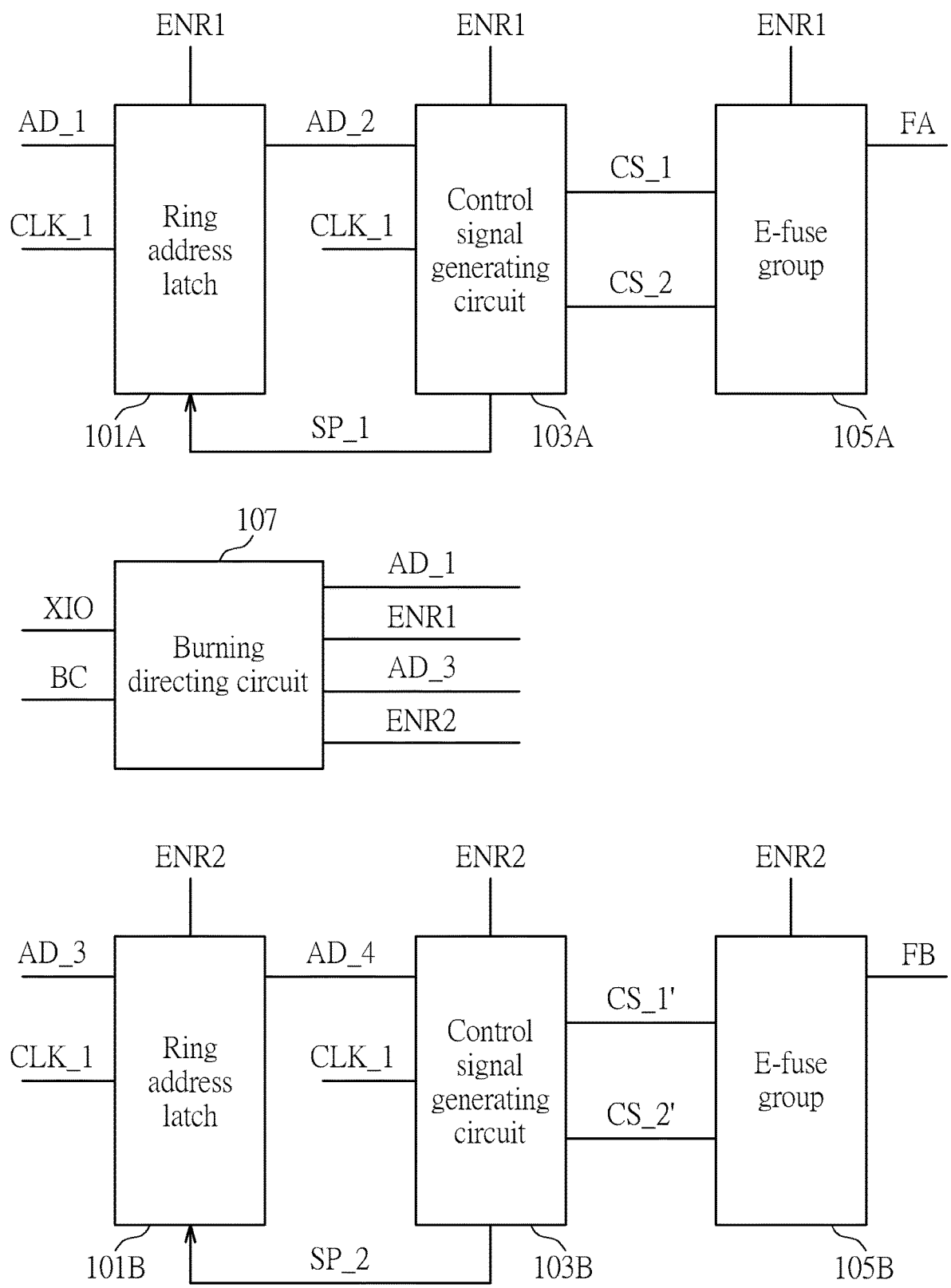
FIG. 11 is a block diagram illustrating an E-fuse burning circuit according to another embodiment of the present invention.

In some cases, the first serial input data XIO comprises a row failed address and a column failed address. For example, as illustrated in FIG. 11, a first bank (not shown) corresponding to the E-fuse group 105A has a row address of the failed cells, and a second bank (not shown) corresponding to another E-fuse group 105B has a column address of the failed cells. In such case, the burning directing circuit 107 is further configured to receive a bank code BC to accordingly assign some input bits of the first serial input data XIO to correspond to the first bank and to accordingly assign some input bits of the first serial input data XIO to correspond to the second bank.

Figure 12:
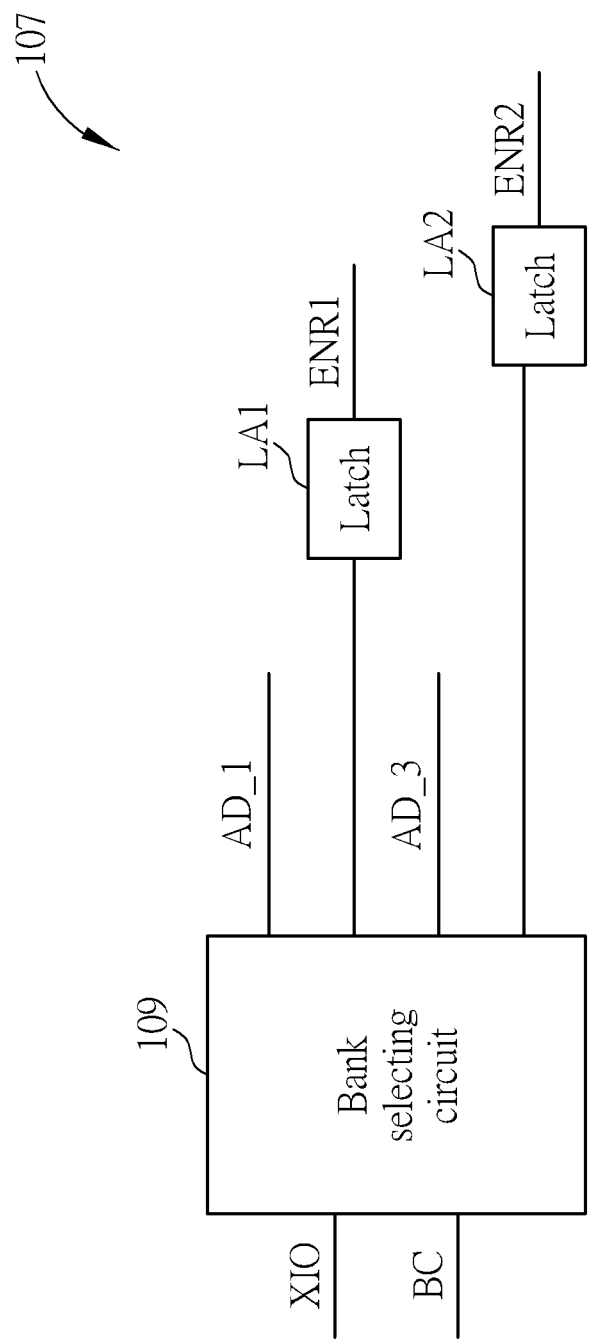
FIG. 12 is a block diagram illustrating an E-fuse burning circuit according to still another embodiment of the present invention.

FIG. 12 is a block diagram illustrating the structures of the burning directing circuit 107, according to one embodiment of the present invention. Please refer to FIG. 12, the burning directing circuit 107 comprises a bank selecting circuit 109, a latch LA1, and a latch LA2. The bank selecting circuit 109 is configured to receive the first serial input data XIO and the bank code BC. Via using the bank code BC, the bank selecting circuit 109 can identify which bank does the first serial input data XIO correspond to. Latches LA1 and LA2 are configured to generate burning directing signals ENR1 and ENR2.

For example, the first serial input data XIO is 24-bits serial data in FIG. 12 (shown as XIO[0:23]), which comprises an address of the failed cells of two banks. For more detail, XIO[0:10] means failed addresses of the first bank, and XIO[12:22] means failed addresses of the second bank. In the present embodiment, the failed addresses of the first bank are row failed addresses, which is 11-bits data. Therefore, XIO[11] must have information indicating the failed addresses of the first bank are row failed addresses. Similarly, the failed addresses of the second bank are column failed addresses, which is 8-bits data. Therefore, XIO[23] must have information indicating the failed addresses of the second bank are column failed addresses.

Please refer to FIG. 12, via the bank selecting circuit 109, the first twelve bits are identified as related data of the first bank, and the last twelve bits are identified as related data of the first bank. After that, XIO[0:10] is transmitted to the ring address latch 101A as first input address AD_1, and XIO[11] is transmitted to the latch LA1 to generate the burning directing signal ENR1. Also, the XIO[12:22] is transmitted to the ring address latch 101B as third input address AD_3, and XIO[23] is transmitted to the latch LA2 to generate the burning directing signal ENR2. The burning directing signal ENR1 is used to control the ring address latch 101A, the control signal generating circuit 103A and the E-fuse group 105A. Also, the burning directing signal ENR2 is used to control the ring address latch 101B, the control signal generating circuit 103B and the E-fuse group 105B.

Please refer to FIG. 11, in the present embodiment, the bit data latched in the ring address latch 101A is used to generate failed address FA to indicate the row address of failed cells of the first bank and the bit data latched in the ring address latch 101B is used to generate failed address FB to indicate the row address of failed cells of the second bank. If bit numbers of the row address of failed cells and the column address of failed cells are different, the ring address latches 101A and 101B have different operations for the writing operation and for the burning operation.

Figure 13:
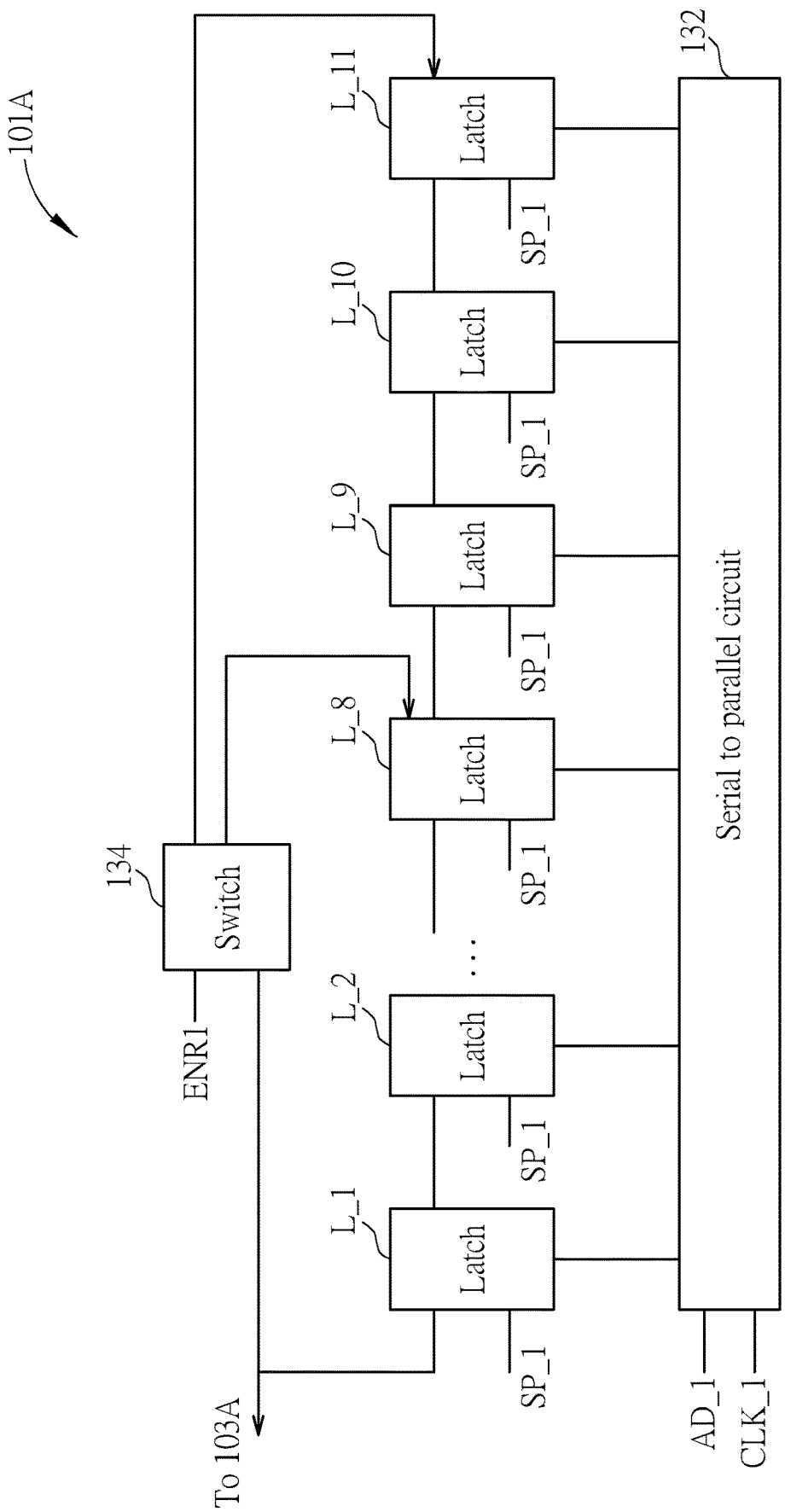
FIG. 13 is a circuit diagram illustrating the first latch circuit according to one embodiment of the present invention.

FIG. 13 is a circuit diagram of the ring address latch 101A, according to one embodiment of the present invention. Please refer to FIG. 13, the ring address latch 101A comprises a serial to parallel transferring circuit 132 and a plurality of latch stages L_1~L_11, which can be implemented by latches. Referring to FIG. 13, the ring address latch 101A comprises a switch 134, which can be controlled by the burning directing signal ENR1 to control the 101A to apply the first number of stages or to apply the second number of the latch stages.

Figure 14:
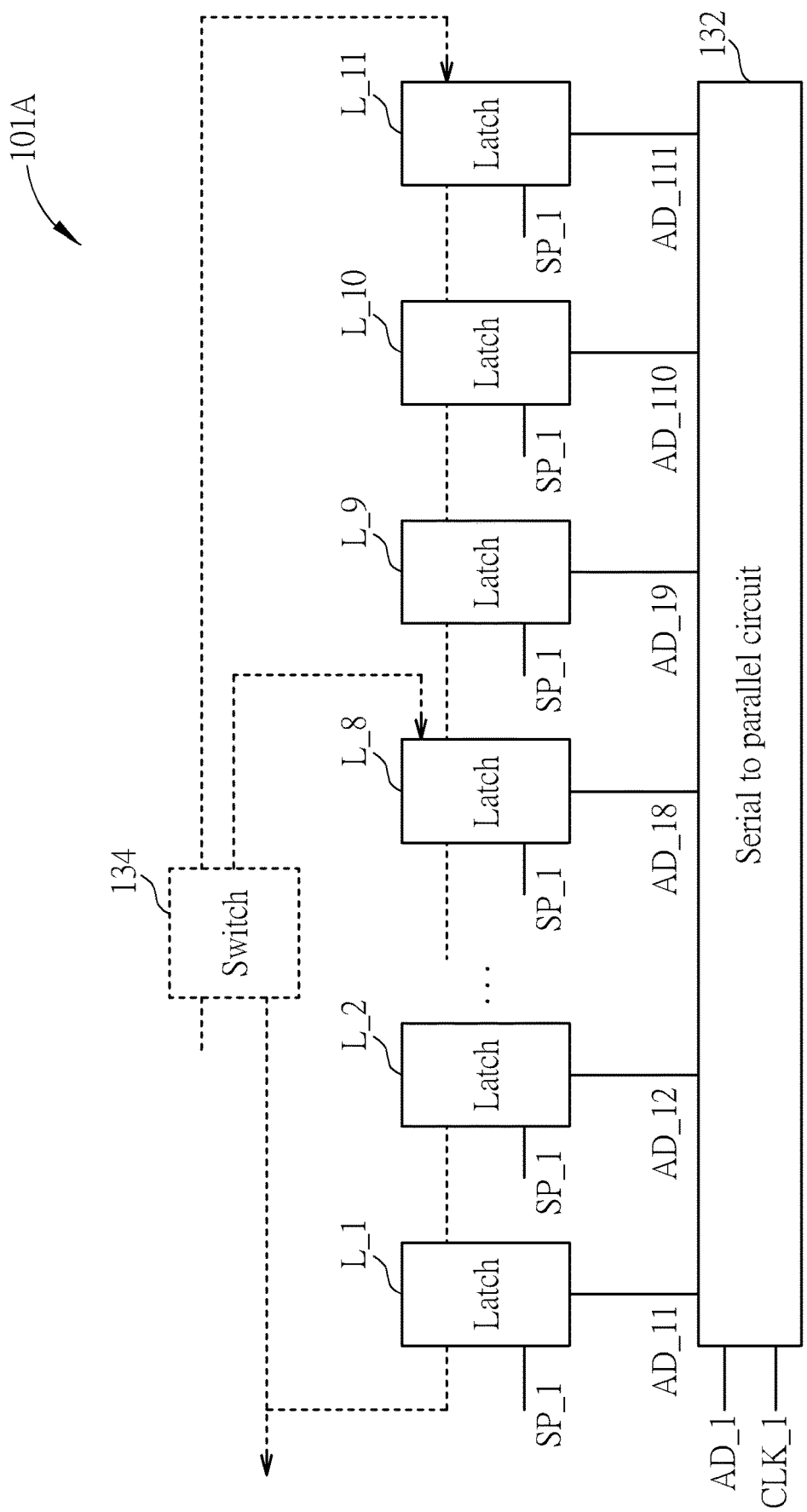
FIG. 14 and FIG. 15 are circuit diagrams illustrating write operations of the first latch circuit according to one embodiment of the present invention.

FIG. 14 is a block diagram illustrating a writing operation to write the first input address AD_1 (the row failed address in the embodiment of FIG. 11) to the ring address latch 101A. A first stop signal SP_1 is applied to control whether the data latched in the latch stage is shifted or not. In such case, the first stop signal SP_1 has a logic value 0 and the data latched in the latches L_1-L_11 is not shifted. As illustrated in FIG. 14, a first bit AD_11 of the first address AD_1 is written to the latch L_1, a second bit AD_12 is written to the latch L_2 . . . , and the final bit (11-th bit AD_111) of the first address AD_1 is written to the latch L_11.

Figure 15:
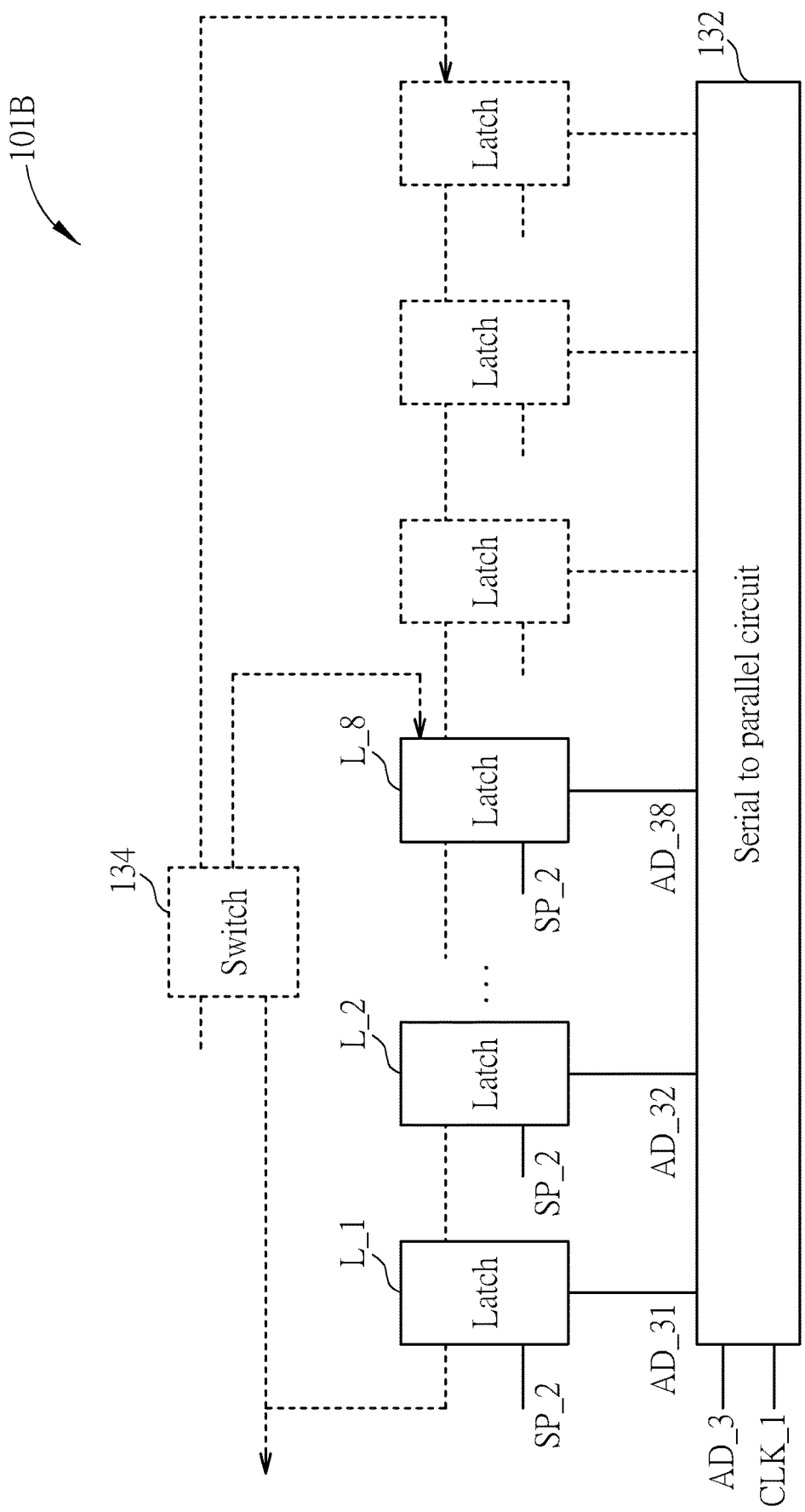

FIG. 15 is a block diagram illustrating a writing operation to write the third input address AD_3 (the column failed address in the embodiment of FIG. 11) to the ring address latch 101B. The circuit of the ring address latch 101B is the same as which of the ring address latch 101A. One difference is that the latch stages L_1~L_11 in the ring address latch 101B are controlled by a second stop signal SP_2, and the switch 134 is controlled by the burning directing signal ENR2. In such case, the second stop signal SP_2 has a logic value 0 and the data latched in the latch is not shifted. As illustrated in FIG. 15, a first bit AD_31 of the third address AD_3 is written to the latch L_1, a second bit AD_32 is written to the latch L_2 . . . , and the final bit (8-th bit AD_38) of the third address AD_3 is written to the latch L_8.

Figure 16:
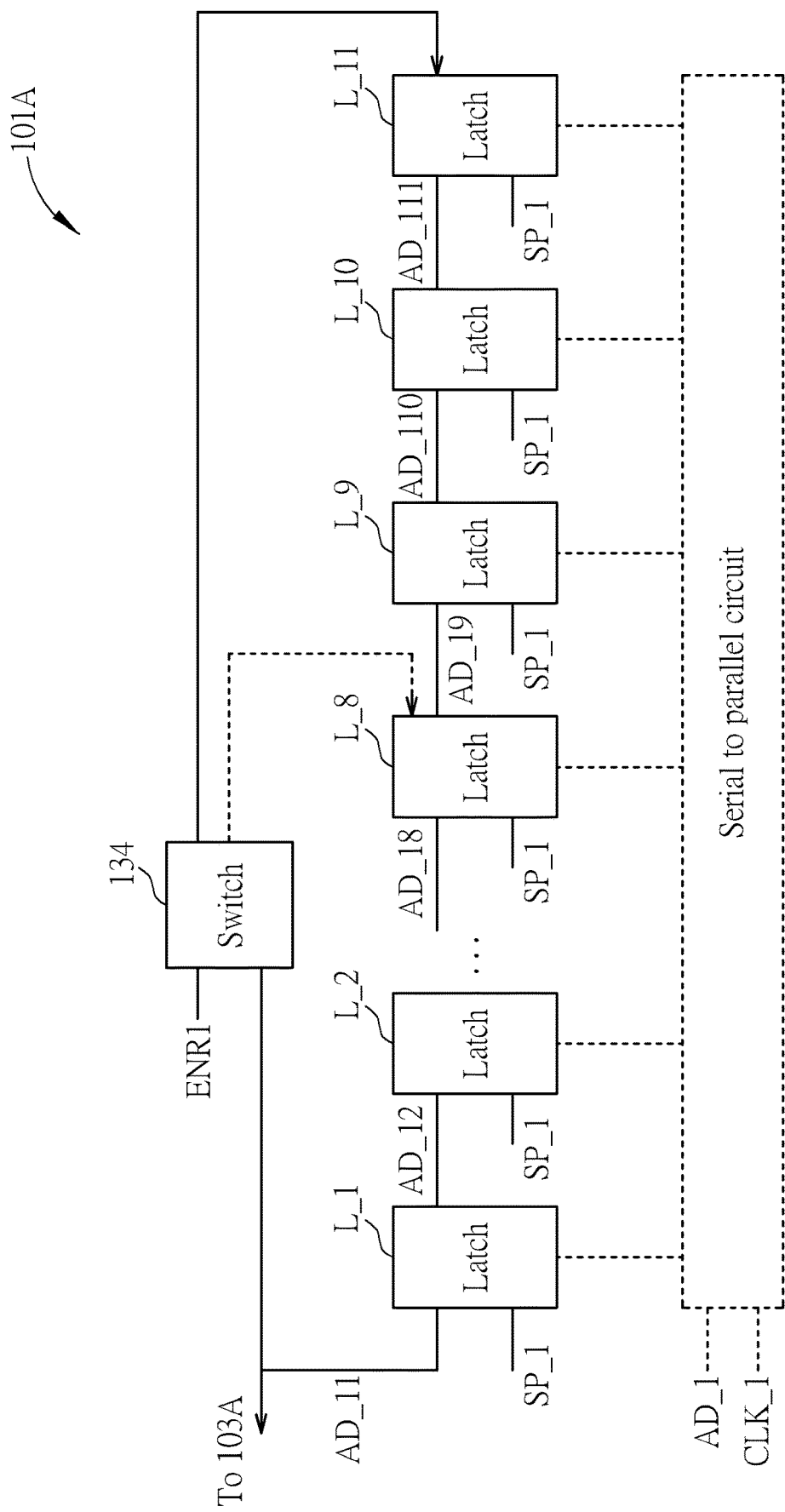
FIG. 16 and FIG. 17 are circuit diagrams illustrating burning operations of the first latch circuit according to one embodiment of the present invention.

FIG. 16 is a circuit diagram illustrating burning operations of the ring address latch 101A according to one embodiment of the present invention. In such case, the first stop signal SP_1 has a logic value 1, such that the data stored in the latch can be shifted. As illustrated in FIG. 16, via the switch 134, the latches L_1~L_11 are used. Data latched in each latch is shifted to a previous latch. For example, the data latched in the latch L_11 is shifted to the latch L_10, the data latched in the latch L_10 is shifted to the latch L_9 . . . and so on. The data latched in the latch L_1 is also transmitted to the final used latch L_11 while being transmitted to the data sampling circuit 103A. In this embodiment, the function of the first stop signal SP_1 is the same as a second clock signal CLK_2 in FIG. 9.

Figure 17:
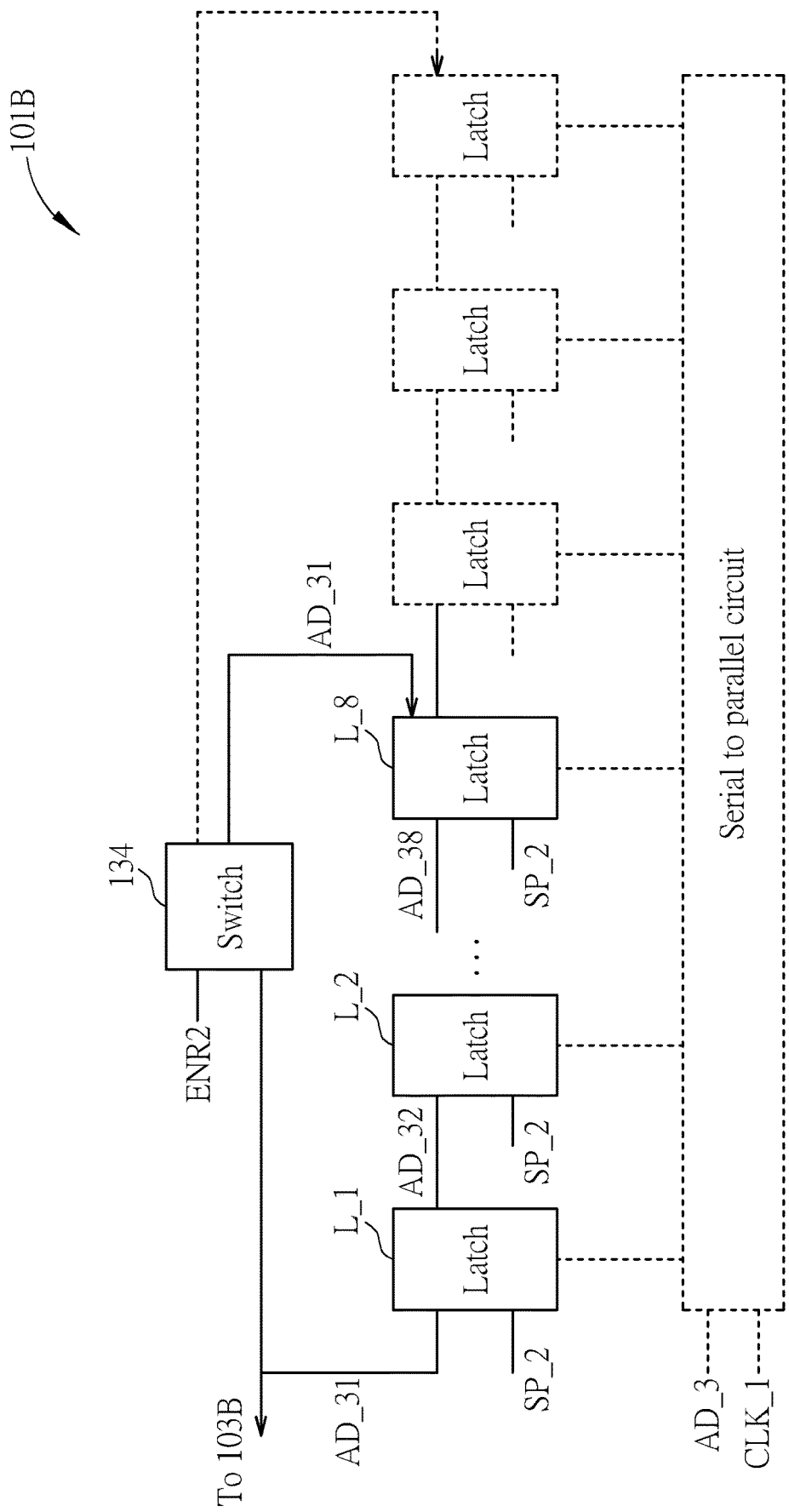

FIG. 17 is a circuit diagram illustrating burning operations of the ring address latch 101B according to one embodiment of the present invention. In such case, the second stop signal SP_2 has a logic value 1, such that the data stored in the latch can be shifted. As illustrated in FIG. 17, via the switch 134, the latches L_1~L_8 are used. Data latched in each latch is shifted to a previous latch. For example, the data latched in the latch L_8 is shifted to the latch L_7, the data latched in the latch L_7 is shifted to the latch L_6 . . . and so on. The data latched in the latch L_1 is also transmitted to the final used latch L_8 while being transmitted to the data sampling circuit 103B. In this embodiment, the function of the second stop signal SP_2 is the same as a second clock signal CLK_2 in FIG. 9.

As above-mentioned, signal transmitting of the ring address latches 101A, 101B are controlled by the first stop signal SP_1 and the second stop signal SP_2 during the burning operation. The first stop signal SP_1 and the second stop signal SP_2 are respectively generated by the control signal generating circuit 103A. Also, the burning directing signals ENR1 and ENR2 are used to control which stages of the latch stages L_1~L_11 are used. In the present embodiment, the row failed addresses are 11-bits data, thus 11 stages of the latch stages L_1~L_11 are used. Also, the column failed addresses are 8-bits data, thus 8 stages of the latch stages L_1~L_8 are used.

Figure 18:
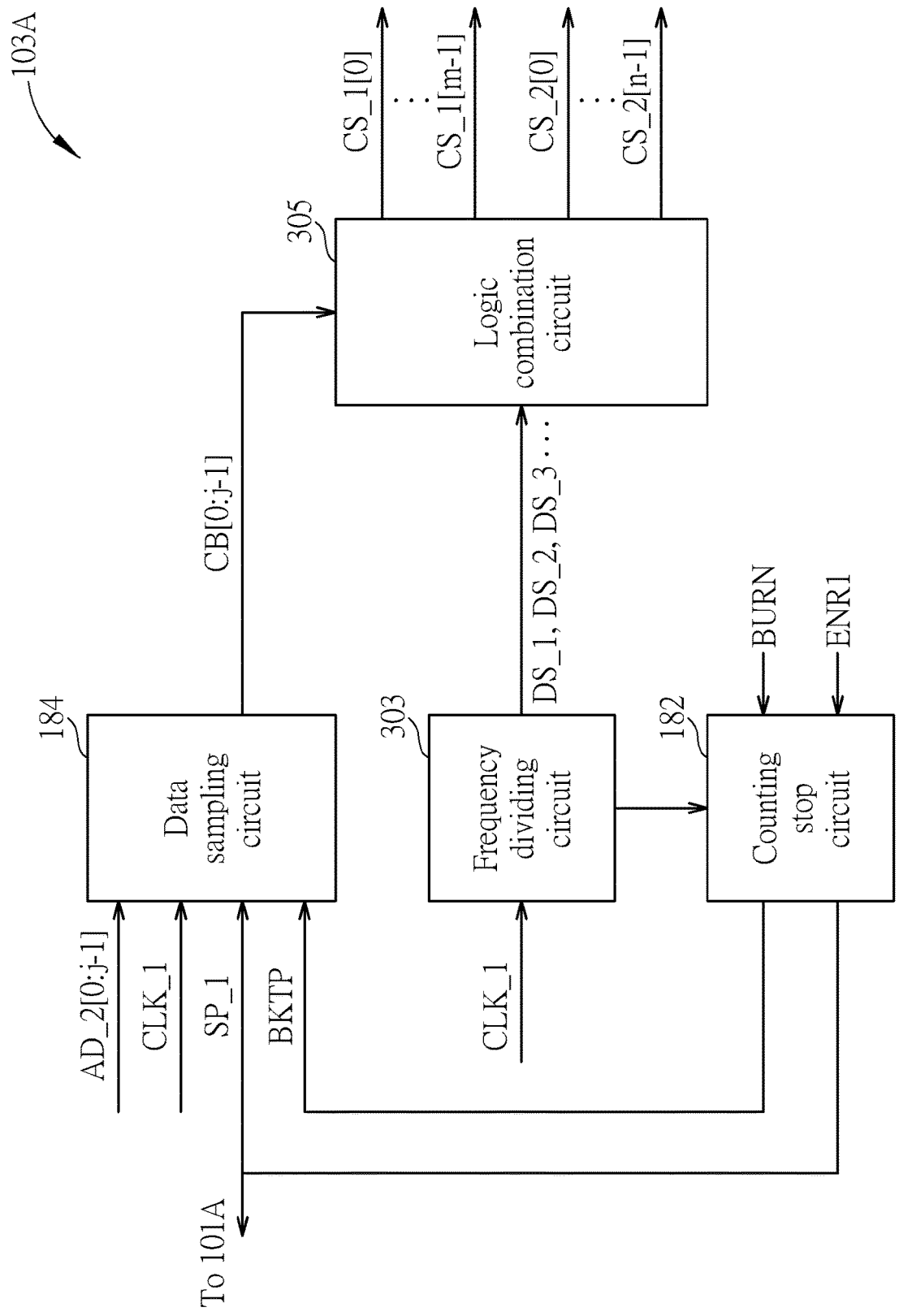
FIG. 18 is a circuit diagram illustrating the data sampling circuit receiving corresponding stop signals.

FIG. 18 is a schematic diagram illustrating how the first stop signal SP_1 is generated. In this embodiment, the control signal generating circuit 103A comprises a data sampling circuit 184, a frequency dividing circuit 303 and a logic combination circuit 305. Please refer to FIG. 18, the counting stop circuit 182 receives the burning directing signal ENR1 to generate the first stop signal SP_1 and the refer signal BKTP to the data sampling circuit 184. Additionally, the first stop signal SP_1 is simultaneously transmitted to the ring address latch 101A to control the ring address latch 101A. Please refer to above-mentioned descriptions of the data sampling circuit 301, the frequency dividing circuit 303 and the logic combination circuit 305 in above-mentioned disclosure to understand detail structures of the control signal generating circuit 103A in FIG. 18.

Figure 19:
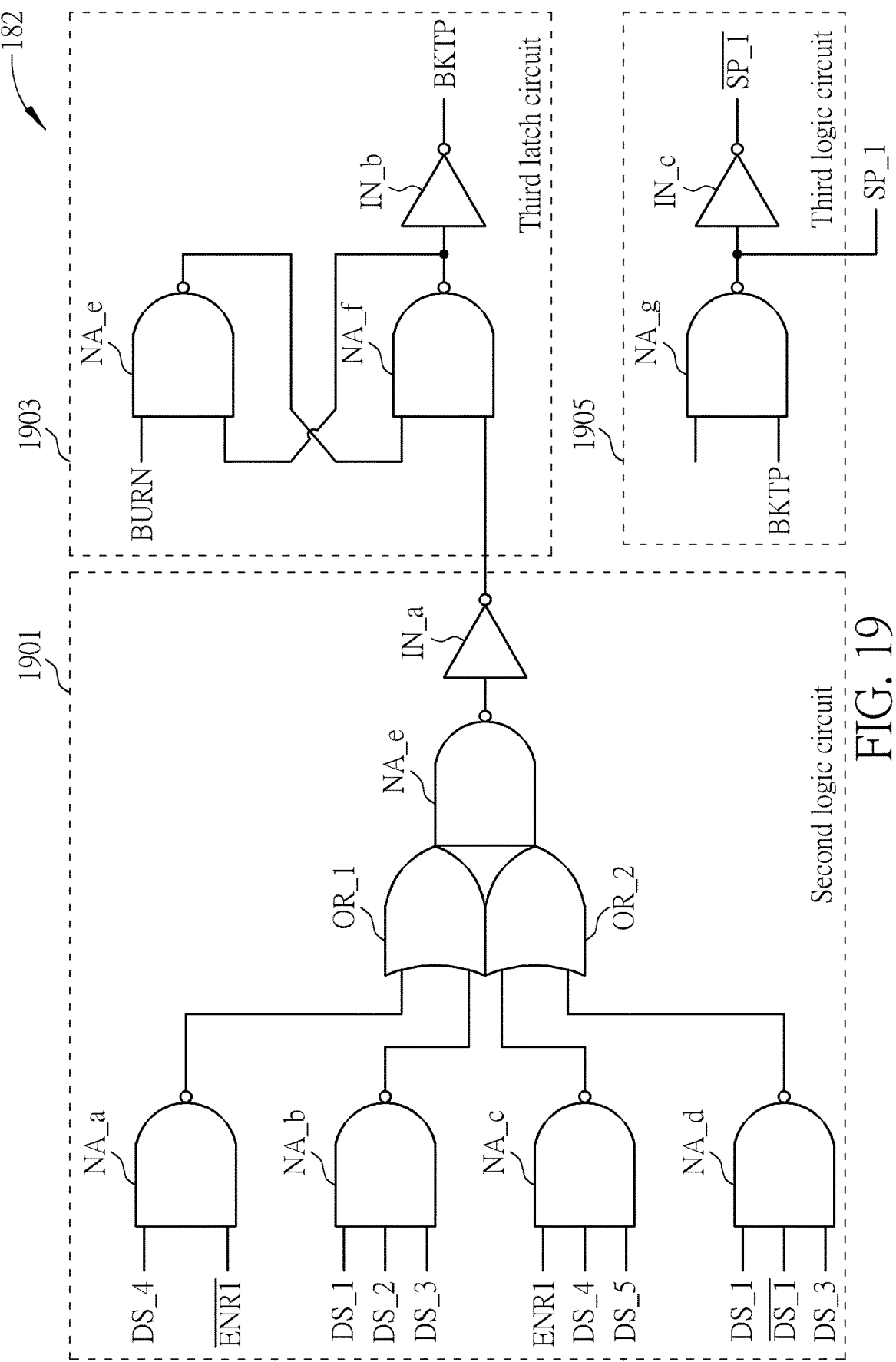
FIG. 19 is a circuit diagram illustrating circuit structures of the counting stop circuit 1103, according to one embodiment of the present invention.

FIG. 19 is a circuit diagram illustrating circuit structures of the counting stop circuit 182 in FIG. 18, according to one embodiment of the present invention. As illustrated in FIG. 19, the counting stop circuit 182 comprises a second logic circuit 1901, a third latch circuit 1903 and a third logic circuit 1905. The second logic circuit 1901 comprises NAND gates NA_a-NA_d, which are respectively coupled to receiving terminals of OR gates OR_1, OR_2. The OR gates OR_1, OR_2 are coupled to input terminals of the NAND gate NA_e, which is coupled to the inverter IN_a. The NAND gates NA_a-NA_d are also respectively named a first, a second, a third, and a fourth NAND gate in the second logic circuit 1901.

The NAND gate NA_a and the NAND gate NA_b receive data related to the column failed address. Also, the NAND gate NA_c and the NAND gate NA_d receive data related to the row failed address. Specifically, the NAND gate NA_a receives the inverted burning directing signal /ENR1 and the frequency divided signal DS_4 from the frequency dividing circuit 303 in FIG. 5. Also, the NAND gate NA_b receives the frequency divided signals /DS_1, /DS_2 and /DS_3 from the frequency dividing circuit 303 in FIG. 18. Further, the NAND gate NA_c receives the burning directing signal ENR1 and the frequency divided signals DS_4 and /DS_5 from the frequency dividing circuit 303 in FIG. 5. Additionally, the NAND gate NA_d receives the frequency divided signals DS_1 and DS_3 from the frequency dividing circuit 303 in FIG. 5, and the inverted frequency divided signal /DS_3.

The third latch circuit 1903 comprises a NAND gates NA_e, a NA_f and the inverter IN_b. The NAND gate NA_e receives a burning command signal BURN which can indicate a burning operation is performed or not, and the NAND gate NA_f receives an output of the inverter IN_a. The inverter IN_b is coupled to an output terminal of the NAND gate NA_f and a receiving terminal of the NAND gate NA_e, to generate the refer signal BKTP. The NAND gates NA_e and NA_f are also respectively named a fifth and a sixth NAND gate in the third latch circuit 1903.

The third logic circuit 1905 comprises a NAND gate NA_g (also named a seventh NAND gate) configured to generate the first stop signal SP_1, and an inverter IN_c to generate the inverted first stop signal $\overline{SP\_1}$.

Other detail connections between each component of the counting stop circuit 182 are illustrated in FIG. 19, thus descriptions thereof are omitted for brevity here. Please note, persons skilled in the art can change the circuit structures of the counting stop circuit 182 based on the disclosure and teaching of the present invention, to acquire the same function. Such variations should also fall in the scope of the present invention. Further, in view of FIG. 11, the control signal generating circuit 103B also comprises a counting stop circuit (not shown), which has the same structure as which of FIG. 19. The counting stop circuit receives the burning directing signal ENR2 to generate the second stop signal SP_2 and a refer signal BKTP' to the data sampling circuit 184 (not shown) in the control signal generating circuit 103B. The second stop signal SP_2 is simultaneously transmitted to the ring address latch 101B to control the ring address latch 101B.

Figure 20:
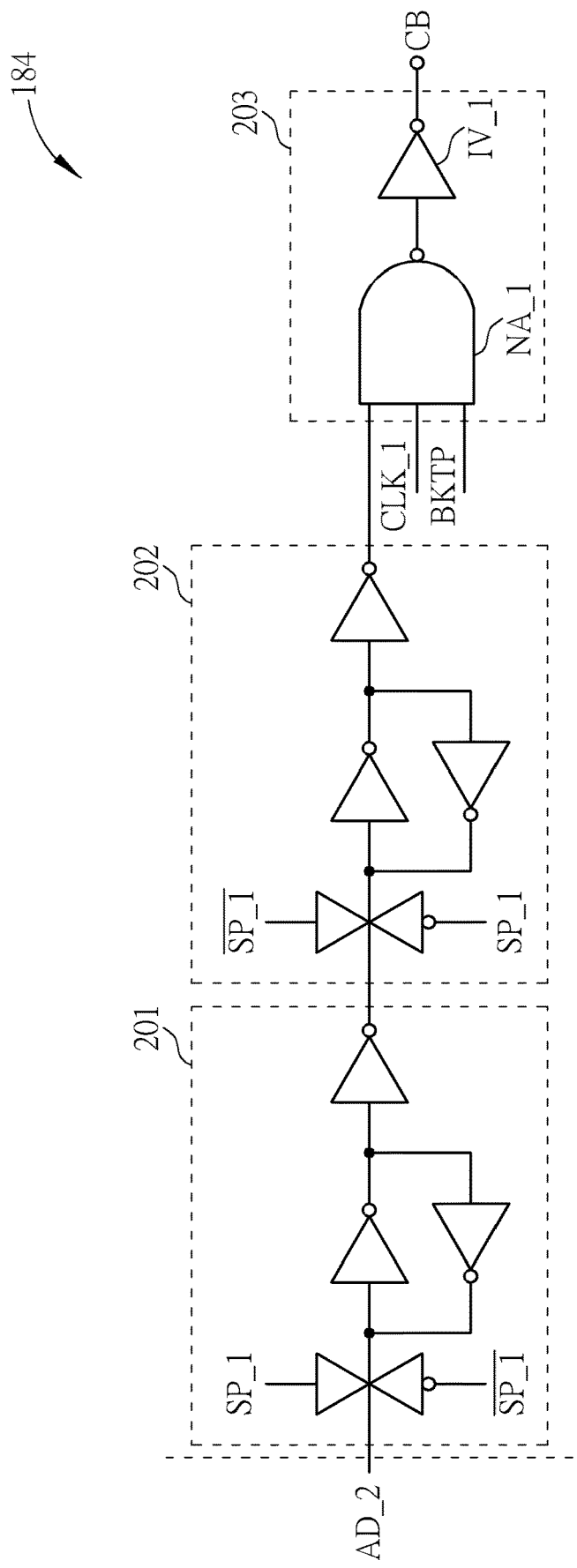
FIG. 20 is a wave chart illustrating operations for the E-fuse burning circuit according to one embodiment of the present invention.

FIG. 20 is a circuit diagram illustrating circuit structures of the data sampling circuit 184 in FIG. 18 according to one embodiment of the present invention. As illustrated in FIG. 20, the data sampling circuit 184 comprises a first sampling stage 201, a second sampling stage 202, and a logic circuit 203. The first sampling stage 201 is configured to sample bits of the second input address AD_2 [0:j−1] at falling edges of the first stop signal SP_1 in sequence. The second sampling stage 202 is configured to sample bits of the second input address AD_2 [0:j−1] at rising edges of the first stop signal SP_1 in sequence.

In this embodiment, the logic circuit 203 comprises a NAND logic gate NA_1 and an inverter IV_1. When the refer signal BKTP=1, if the first clock signal CLK_1 has a logic value 1, and a third input address AD_3 output by the second sampling stage 402 also has a logic value 1, the logic circuit 203 outputs the combined signal CB having a logic value 1; on the contrary, if the first clock signal CLK_1 has a logic value 1 and the third input address AD_3 output by the second sampling stage 202 has a logic value 0, the logic circuit 203 outputs the combined signal CB having a logic value 0. When BKPT=0, the combined signal CB has a logical value of 0 regardless of the logical value of the third input address AD_3 and the first clock signal CLK_1.

Figure 21:
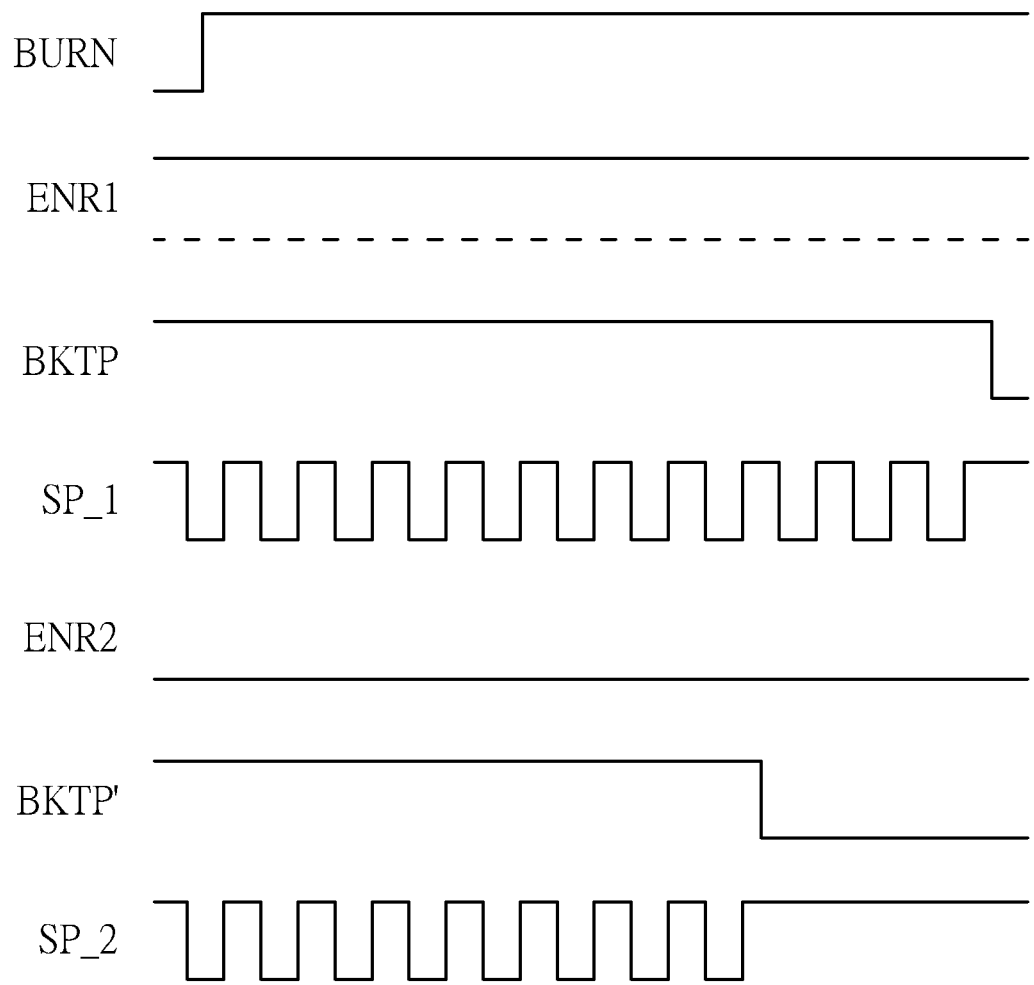
FIG. 21 is a flow chart illustrating steps of an E-fuse burning method according to another embodiment of the present invention.

FIG. 21 is a wave chart illustrating operations for the E-fuse circuit of FIG. 11 according to one embodiment of the present invention. Please refer to FIG. 11 and FIG. 21 to understand the concept of the present invention for more clear. In this embodiment, XIO[0:10] is transmitted to the ring address latch 101A as first input address AD_1, XIO[11] is used to generate the burning directing signal ENR1. Also, the XIO[12:22] is transmitted to the ring address latch 101B as third input address AD_3, and XIO[23] is used to generate the burning directing signal ENR2. As illustrated in FIG. 21, the burning directing signal ENR1 has a value 1, it means the ring address latch 101A latches a row failed address. Therefore, the ring address latch 101A uses 11 latches to latch 11 bits data.

The burning directing signal ENR2 has a value 0, it means the ring address latch 101B latches a column failed address. Therefore, the ring address latch 101B uses 8 latches to latch 8 bits data.

Please refer to FIG. 11 and FIG. 21, it means a burning operation is performed when a burning command signal BURN transits from logic 0 to logic 1. Since the first input address AD_1 is 11 bits serial data, thus needs 11 rising edges of the first stop signal SP_1 to shift data. Besides, the third input address AD_3 is 8 bits serial data, thus needs 8 rising edges of the second stop signal SP_2 to shift data. Please refer to FIG. 19 and FIG. 21, when the first stop signal SP_1 reaches the 11-th rising edge, the logic value of the refer signal BKTP signal transits from logic 1 to logic 0, thereby the first stop signal SP_1 stops generating pulses. Also, when the second stop signal SP_2 reaches the 8-th rising edge, the logic value of the refer signal BKTP' transits from logic 1 to logic 0, thereby the second stop signal SP_2 stops generating pulses.

In view of above-mentioned embodiments, the ring address latch 101A applies a first number of the stages to output the second input address AD_2 when the burning directing signal ENR1 indicates the failed address FA is a row failed address. Additionally, the ring address latch 101B applies a second number of the stages to output the second input address AD_4 when the burning directing signal ENR2 indicates the failed address FB is a column failed address. When a burning command signal BURN is received, it means burning operations are performed. At the same time, the first stop signal SP_1 and the second stop signal SP_2 start to generate clock pulses. If any one of the first control signals CS_1 has a logic value 1 and any one of the second control signals CS_2 has a logic value 1, a corresponding fuse of the E-fuse group 105A is burned; if any one of the first control signals CS_1' has a logic value 1 and any one of the second control signals CS_2' has a logic value 1, a corresponding fuse of the E-fuse group 105B is burned. If the refer signal BKTP signal of the control signal generating circuit 103A transits from logic 1 to logic 0, the first stop signal SP_1 stops generating pulses, thus the control signal generating circuit 103A stop operating. If the refer signal BKTP signal of the control signal generating circuit 103B transits from logic 1 to logic 0, the second stop signal SP_2 stops generating pulses, thus the control signal generating circuit 103B stop operating.

An E-fuse burning method can be acquired based on operations of above-mentioned circuits, the steps thereof are omitted for brevity here.

For the brevity, failed addresses for two banks are taken as examples in FIG. 11. However, the present invention is not limited to such examples. Failed addresses for more than two banks can also be generated in view of the disclosure of the present invention.

In view of above-mentioned embodiments, the burning of the row failed address or the column failed address can be controlled by the input data comprising the failed address. Besides, the burning of the row failed address or the column failed address can be concurrently burned based on above-mentioned embodiments.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An E-fuse burning circuit, comprising:
a burning directing circuit, configured to receive first input data comprising first input address and burning directing data, to generate a burning directing signal according to the burning directing data;
a ring address latch, coupled to the burning directing circuit, configured to latch the first input address responding to a first clock signal, and configured to output second input address responding to the first clock signal; and
a control signal generating circuit, configured to generate at least one stop signal to determine whether the data in the ring address latch is shifted or not;
wherein the ring address latch applies a first number of the stages to output the second input address when the burning directing signal indicates a row of the E-fuse circuit is to be burned and applies a second number of the stages to output the second input address when the burning directing signal indicates a column of the E-fuse circuit is to be burned.

2. The E-fuse burning circuit of claim 1, wherein the burning directing circuit is further configured to receive a bank code and to assign the first input address as a row failed address or a column failed address according to the bank code.

3. The E-fuse burning circuit of claim 2, wherein the first input data further comprises a third input address, the burning directing circuit is further configured to assign the first input address as a row failed address and to assign the third input address as a column failed address according to the bank code.

4. The E-fuse burning circuit of claim 1, wherein a bit of the first input address latched in a first stage of the ring address latch is transmitted to a last stage of the ring address latch when the bit latched in the first stage is transmitted to the control signal generating circuit, wherein the ring address latch further comprises a switch, which is controlled by the burning directing signal to control the ring address latch to apply the first number of stages or to apply the second number of stages.

5. The E-fuse burning circuit of claim 1, wherein the control signal generating circuit comprises a counting stop circuit configured to generate a first stop signal according to the burning directing signal and the burning command signal.

6. The E-fuse burning circuit of claim 5, wherein the control signal generating circuit further comprises:
a data sampling circuit, configured to sample the second input address by the first clock signal to generate a combined signal;
a frequency dividing circuit, configured to generate at least one frequency divided signal according to the first clock signal; and
a logic combination circuit, configured to generate at least one control signal according to the combined signal and at least one of the frequency divided signal;
wherein the counting stop circuit transmits the first stop signal to the data sampling circuit to control the data sampling circuit.

7. The E-fuse burning circuit of claim 6, wherein the data sampling circuit comprises:
a first sampling stage, configured to sample the second input address at falling edges of the first stop signal;
a second sampling stage, configured to sample the second input address at rising edges of the first stop signal; and
a first logic circuit, configured to generate the combined signal according to outputs of the first sampling stage and the second sampling stage, according to a refer signal generated by the counting stop circuit and according to the first clock signal.

8. The E-fuse burning circuit of claim 7, wherein the first logic circuit comprises:
a NAND logic gate, configured to receive the output of the second sampling stage, the first clock signal and the refer signal; and
an inverter, coupled to an output of the first NAND logic gate, to generate the combined signal.

9. The E-fuse burning circuit of claim 7, wherein the counting stop circuit comprises:
a second logic circuit, configured to receive an inverted signal of the burning directing signal, the burning directing signal and the frequency divided signal;
a third latch circuit, coupled to the second logic circuit, configured to receive an output of the second logic circuit and a burning command signal to generate the refer signal; and
a third logic circuit, coupled to the third latch circuit, configured to receive the refer signal to generate the first stop signal and the inverted signal of the first stop signal.

10. The E-fuse burning circuit of claim 9, wherein the second logic circuit comprises:
a first NAND gate, configured to receive the inverted signal of the burning directing signal and at least one of the frequency-divided signal;

a second NAND gate, configured to receive at least one of the frequency-divided signals;
a third NAND gate, configured to receive the burning directing signal and at least one of the frequency-divided signals; and
a fourth NAND gate, configured to receive at least one of the frequency-divided signals.

11. The E-fuse burning circuit of claim 9, wherein the third latch circuit comprises:
a fifth NAND gate, configured to receive the burning command signal;
a sixth NAND gate, configured to receive an output of the fifth NAND gate and the output of the second logic circuit; and
an inverter, coupled to an output terminal of the sixth NAND gate and an input terminal of the fifth NAND gate, configured to output the refer signal.

12. The E-fuse burning circuit of claim 9, wherein the third logic circuit comprises:
a seventh NAND logic gate, configured to receive the refer signal to generate the first stop signal; and
an inverter, coupled to the NAND logic gate, configured to receive an output of the NAND logic gate to generate the inverted signal of the first stop signal.

13. An E-fuse burning method, comprising:
(a) receiving first input data comprising first input address and burning directing data, to generate a burning directing signal according to the burning directing data by a burning directing circuit;
(b) latching the first input address responding to a first clock signal by a ring address latch, and generating second input address responding to the first clock signal by the ring address latch;
(c) generating at least one stop signal to determine whether the data in the ring address latch is shifted or not; and
(d) controlling the ring address latch to apply a first number of the stages to output the second input address when the burning directing signal indicates a row of the E-fuse circuit is to be burned and applies a second number of the stages to output the second input address when the burning directing signal indicates a column of the E-fuse circuit is to be burned.

14. The E-fuse burning method of claim 13, wherein the step (a) further comprises: receiving a bank code and assigning the first input address as a row failed address or a column failed address according to the bank code by the burning directing circuit.

15. The E-fuse burning method of claim 14, wherein the first input data further comprises a third input address, and the step (a) further comprises: assigning the first input address as a row failed address and to assign the third input address as a column failed address according to the bank code by the burning directing circuit.

16. The E-fuse burning method of claim 13, wherein a bit of the first input address latched in a first stage of the ring address latch is transmitted to a last stage of the ring address latch when the bit latched in the first stage is transmitted to the control signal generating circuit, wherein the ring address latch further comprises a switch, which is controlled by the burning directing signal to control the ring address latch to apply the first number of stages or to apply the second number of stages.

17. The E-fuse burning method of claim 13, wherein the step (c) further comprises: (c1) generating a first stop signal according to the burning directing signal and the burning command signal.

18. The E-fuse burning method of claim 17, wherein the step (c) further comprises:
- (c2) sampling the second input address by the first clock signal to generate a combined signal by a data sampling circuit;
- (c3) generating at least one frequency divided signal according to the first clock signal; and
- (c4) generating at least one control signal according to the combined signal and at least one of the frequency divided signal;

wherein the step (c2) controls the data sampling circuit by the first stop signal.

19. The E-fuse burning method of claim 18, wherein the step (c2) comprises:
- (c5) sampling the second input address at falling edges of the first stop signal and sampling the second input address at rising edges of the first stop signal; and
- (c6) generating the combined signal according to sampling results of the step (c5), according to a refer signal and according to the first clock signal.

* * * * *